US012765015B2

(12) United States Patent
Heo et al.

(10) Patent No.: US 12,765,015 B2
(45) Date of Patent: Oct. 13, 2026

(54) INTEGRATED CIRCUIT DEVICES

(71) Applicant: Samsung Electronics Co., Ltd., Suwon-si (KR)

(72) Inventors: Yoon Heo, Suwon-si (KR); Seokhoon Kim, Suwon-si (KR); Jungtaek Kim, Suwon-si (KR); Pankwi Park, Suwon-si (KR); Moonseung Yang, Suwon-si (KR); Sumin Yu, Suwon-si (KR); Seojin Jeong, Suwon-si (KR); Edward Namkyu Cho, Suwon-si (KR); Ryong Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 567 days.

(21) Appl. No.: 18/140,905

(22) Filed: Apr. 28, 2023

(65) Prior Publication Data

US 2024/0030286 A1 Jan. 25, 2024

(30) Foreign Application Priority Data

Jul. 25, 2022 (KR) ........................ 10-2022-0092062

(51) Int. Cl.
*H01L 29/08* (2006.01)
*H10D 30/01* (2025.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC .... H10D 62/151; H10D 30/014; H10D 30/43; H10D 30/6735; H10D 62/116;
(Continued)

(56) References Cited

U.S. PATENT DOCUMENTS 7,652,308 B2 1/2010 Park et al.
8,395,217 B1 3/2013 Cheng et al.
(Continued)

FOREIGN PATENT DOCUMENTS

KR 100718149 B1 5/2007
KR 10-2021-0092360 A 7/2021
KR 10-2022-0080852 A 6/2022

*Primary Examiner* — Cuong B Nguyen
(74) *Attorney, Agent, or Firm* — Wolf, Greenfield & Sacks, P.C.

(57) ABSTRACT

An integrated circuit device includes a plurality of fin-type active areas extending in a first horizontal direction on a substrate, a plurality of channel regions respectively on the plurality of fin-type active areas, a plurality of gate lines surrounding the plurality of channel regions on the plurality of fin-type active areas and extending in a second horizontal direction that crosses the first horizontal direction, and a plurality of source/drain regions respectively at positions adjacent to the plurality of gate lines on the plurality of fin-type active areas and respectively in contact with the plurality of channel regions, and the plurality of source/drain regions respectively include a plurality of semiconductor layers and at least one air gap located therein.

19 Claims, 26 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/85*** | (2025.01) |
| ***H10P 14/20*** | (2026.01) |

(52) U.S. Cl.
CPC ....... *H10D 30/6735* (2025.01); *H10D 62/116* (2025.01); *H10D 62/121* (2025.01); *H10D 64/017* (2025.01); *H10D 84/856* (2025.01); *H10P 14/3411* (2026.01)

(58) Field of Classification Search
CPC .. H10D 62/121; H10D 64/017; H10D 84/856; H10D 30/6757; H10D 62/822; H10D 64/518; H10D 84/0133; H10D 84/038; H10D 84/83; H10D 84/834; H10D 30/62; H10D 30/6713; H01L 21/02532; H01L 21/0245; H01L 21/02579; H01L 21/0262; H01L 21/02639
See application file for complete search history.

(56) References Cited

U.S. PATENT DOCUMENTS

| | | | | |
|---|---|---|---|---|
| 8,987,794 | B2 | 3/2015 | Rachmady et al. | |
| 10,158,007 | B2 | 12/2018 | Lee et al. | |
| 10,170,638 | B1 | 1/2019 | Reznicek | |
| 10,461,195 | B2 | 10/2019 | Kwon et al. | |
| 10,937,862 | B2 | 3/2021 | Reznicek et al. | |
| 11,043,570 | B2 | 6/2021 | Yeo et al. | |
| 11,211,456 | B2 | 12/2021 | Jung et al. | |
| 11,211,457 | B2 | 12/2021 | Choi et al. | |
| 2021/0217860 | A1* | 7/2021 | Ha ........................ | H10D 64/257 |
| 2022/0336614 | A1* | 10/2022 | Wang ..................... | H10D 30/43 |

* cited by examiner

INTEGRATED CIRCUIT DEVICES

CROSS-REFERENCE TO RELATED APPLICATION

This application is based on and claims priority under 35 U.S.C. § 119 to Korean Patent Application No. 10-2022-0092062, filed on Jul. 25, 2022, in the Korean Intellectual Property Office, and the entire contents of the above-identified application are incorporated by reference herein.

TECHNICAL FIELD

The inventive concepts relate to integrated circuit devices, and more particularly, to integrated circuit devices including field-effect transistors.

BACKGROUND

As down-scaling of integrated circuit devices is rapidly progressing, it is increasingly expected that integrated circuit devices secure not only a fast operation speed but also exhibit high operational accuracy. In addition, as a degree of integration of the integrated circuit device increases and the size thereof decreases, the possibility of occurrence of process defects in a manufacturing process of a nanosheet field-effect transistor may increase. Accordingly, there is a need to develop an integrated circuit device having a new structure capable of reducing or eliminating the possibility of occurrence of process defects and improving the performance and reliability of the nanosheet field-effect transistor.

SUMMARY

The present disclosure provides integrated circuit devices capable of providing stable performance and improved reliability in nanosheet field-effect transistors thereof.

According to some aspects of the inventive concepts, there is provided an integrated circuit device including a plurality of fin-type active areas extending in a first horizontal direction on a substrate; a plurality of channel regions respectively on the plurality of fin-type active areas; a plurality of gate lines surrounding the plurality of channel regions on the plurality of fin-type active areas and extending in a second horizontal direction that crosses the first horizontal direction; and a plurality of source/drain regions each arranged at positions adjacent to at least one of the plurality of gate lines on a respective one of the plurality of fin-type active areas and in contact with at least one of the plurality of channel regions. Each of the plurality of source/drain regions may have a bottom surface in contact with the respective one of the plurality of fin-type active areas, and the plurality of source/drain regions may respectively include a plurality of semiconductor layers and at least one air gap located therein. The plurality of semiconductor layers may include a first semiconductor layer including a part in contact with the at least one of the plurality of channel regions and a part in contact with the respective one of the plurality of fin-type active areas; a second semiconductor layer on the first semiconductor layer; and a third semiconductor layer on the second semiconductor layer.

According to other aspects of the inventive concepts, there is provided an integrated circuit device including a plurality of fin-type active areas extending in a first horizontal direction on a substrate; a plurality of nanosheets having surfaces that face fin top surfaces of the plurality of fin-type active areas, each of the plurality of nanosheets spaced apart from the fin top surfaces at different distances in a vertical direction; a plurality of gate lines extending in length on the plurality of fin-type active areas in a second horizontal direction that crosses the first horizontal direction, each of the plurality of gate lines surrounding a respective one of the plurality of nanosheets; and a plurality of source/drain regions having side surfaces that face the plurality of nanosheets in the first horizontal direction, wherein the plurality of source/drain regions respectively have bottom surfaces in contact with the plurality of fin-type active areas. Each of the plurality of source/drain regions includes a respective plurality of semiconductor layers and at least one air gap located therein; and each respective plurality of semiconductor layers may include: a first semiconductor layer in contact some of the plurality of nanosheets in contact with at least one of the fin-type active areas; a second semiconductor layer on the first semiconductor layer; and a third semiconductor layer on the second semiconductor layer.

According to other aspects of the inventive concepts, there is provided an integrated circuit device including a first fin-type active area extending in a first horizontal direction on a substrate and in a first region of the substrate, a second fin-type active area extending in the first horizontal direction on the substrate and in a second region of the substrate, first nanosheet stacks each including a plurality of first nanosheets facing a fin top surface of the first fin-type active area at a position spaced apart from the fin top surface and having different distances in a vertical direction from fin top surface, second nanosheet stacks each including a plurality of second nanosheets having surfaces that face a first fin top surface of the second fin-type active area at a position spaced apart from the fin top surface and having different distances in the vertical direction from the fin top surface, a pair of first gate lines on the pair of first nanosheet stacks on the first fin-type active area in the first region, the first gate lines extending in length in a second horizontal direction that crosses first horizontal direction, the pair of first gate lines spaced apart from each other in the first horizontal direction with a first distance therebetween, a pair of second gate lines on the pair of second nanosheet stacks on the second fin-type active area in the second region, extending in length in the second horizontal direction, and spaced apart from each other in the first horizontal direction with a second distance that is greater than the first distance therebetween, a first source/drain region in contact with the plurality of first nanosheets between a pair of first nanosheet stacks in the first region and on the first fin-type active area, and a second source/drain region in contact with the plurality of second nanosheets between the pair of second nanosheet stacks in the second region and on the second fin-type active area, wherein the first source/drain region has a bottom surface in contact with the first fin-type active area, the first source/drain region includes a plurality of semiconductor layers and at least one air gap located therein, the plurality of semiconductor layers includes a first semiconductor layer including a part in contact with each of the pair of first nanosheets and a part in contact with the first fin-type active area, a second semiconductor layer on the first semiconductor layer, and a third semiconductor layer on the second semiconductor layer, each of the first semiconductor layer, the second semiconductor layer, and the third semiconductor layer includes a $Si_{1-x}Ge_x$ layer (where, x≠0) doped with a B element, the first semiconductor layer, the second semiconductor layer, and the third semiconductor layer have different Ge content ratios, the first source/drain region has a top surface at a higher vertical level than a vertical level of a top surface of a nanosheet having a greatest vertical distance from the fin top surface among the plurality of first nanosheets, and the second source/drain region has a top surface at a lower vertical level than a vertical level of the top surface of the first source/drain regions, and the second source/drain region does not include an air gap therein.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
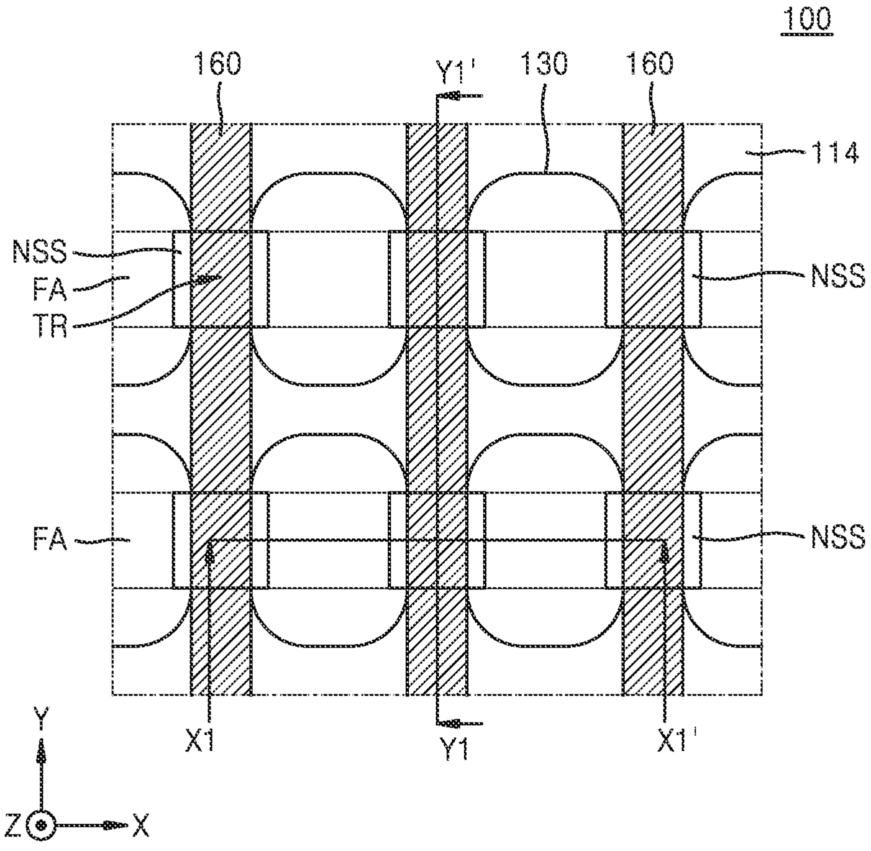
FIG. 1 is a plan layout diagram of some components of an integrated circuit device according to some embodiments.

Hereinafter, some examples of embodiments of the inventive concepts will be described in detail with reference to the accompanying drawings. The same reference numerals are used for the same components in the drawings, and redundant descriptions thereof are omitted.

Figure 2A:
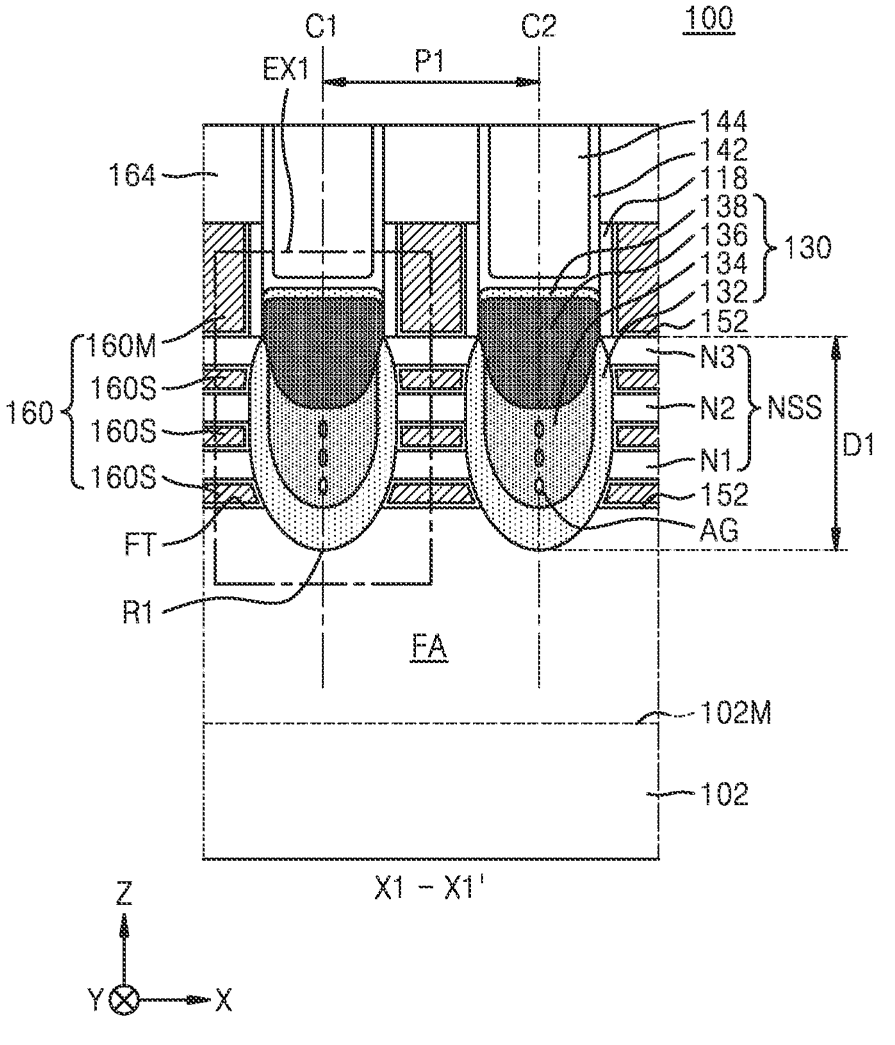
FIG. 2A is a cross-sectional view taken along the line X1-X1' of FIG. 1.
Figure 2B:
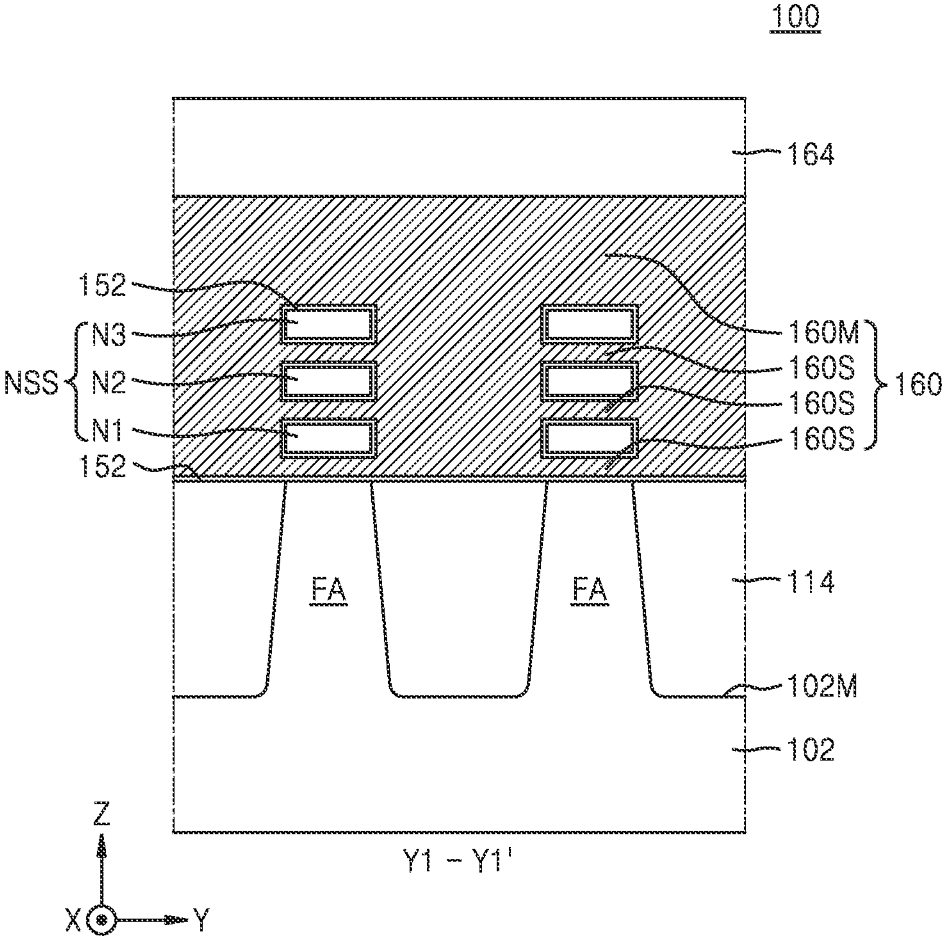
FIG. 2B is a cross-sectional view taken along the line Y1-Y1' of FIG. 1.
Figure 3A:
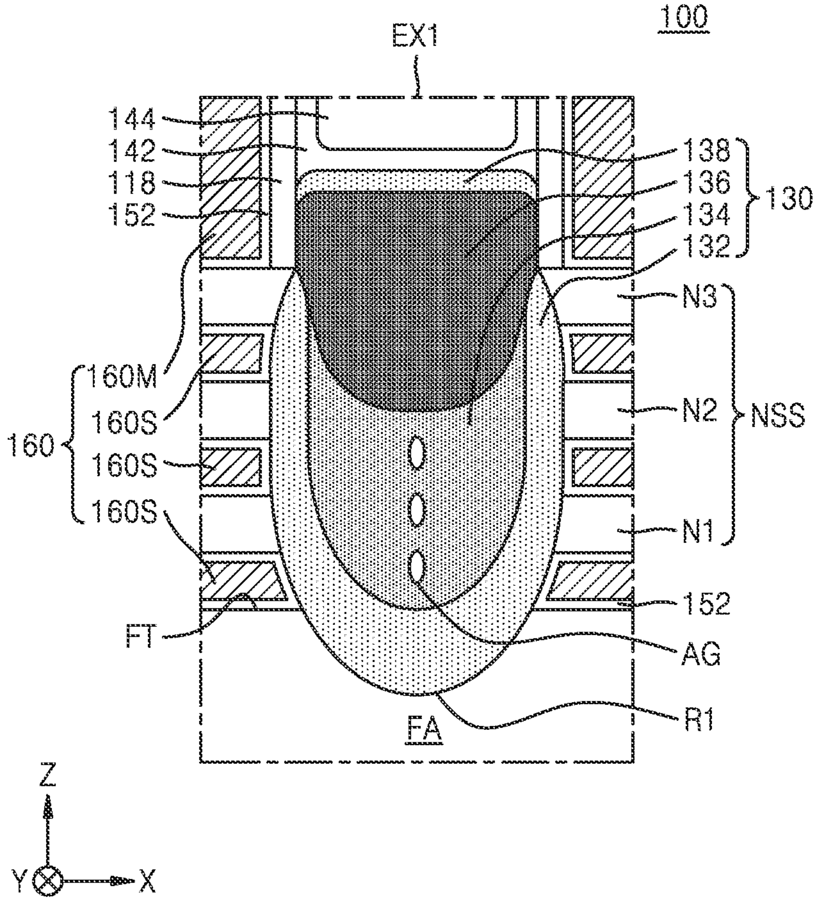
FIGS. 3A and 3B are enlarged cross-sectional views of a local area indicated by "EX1" in FIG. 2A.
Figure 3B:
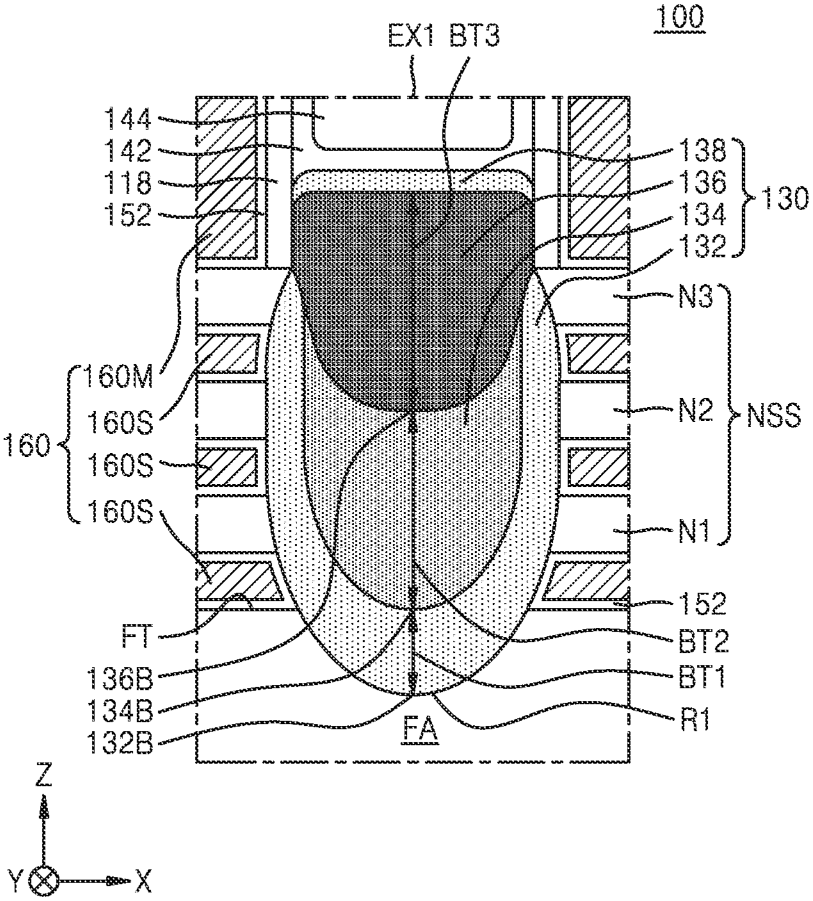

FIG. 1 is a plan layout diagram of some components of an integrated circuit device according to some embodiments. FIG. 2A is a cross-sectional view taken along the line X1-X1' of FIG. 1. FIG. 2B is a cross-sectional view taken along the line Y1-Y1' of FIG. 1. FIGS. 3A and 3B are enlarged cross-sectional views of a local area indicated by "EX1" in FIG. 2A, and are illustrated twice as the same embodiment for convenience of explanation.

Hereinafter, with reference to FIGS. 1, 2A, 2B, and 3A and 3B, an integrated circuit device 100 including a field-effect transistor TR having a gate-all-around structure including an active area in the shape of a nanowire or nanosheet and a gate surrounding the active area is described.

Referring to FIGS. 1, 2A and 2B, the integrated circuit device 100 may include a plurality of fin-type active areas FA protruding upward from a substrate 102 in a vertical direction (Z direction) and extending in length in a first horizontal direction (X direction). A plurality of nanosheet stacks NSS may be respectively on the plurality of fin-type active areas FA. As used herein, the term "nanosheet" refers to a conductive structure having a cross-section substantially perpendicular to a direction in which current flows. It should be understood that the nanosheet may include a nanowire.

The substrate 102 may include a semiconductor, such as Si or Ge, or a compound semiconductor, such as SiGe, SiC, GaAs, InAs, InGaAs, or InP. As used herein, the terms "SiGe", "SiC", "GaAs", "InAs", "InGaAs", and "InP" refer to materials made of elements included in the respective terms, and are not chemical formulas indicating a stoichiometric relationship.

A device isolation layer 114 (see FIG. 1) covering both sidewalls of each of the plurality of fin-type active areas FA may be on the substrate 102. The device isolation layer 114 may include an oxide layer, a nitride layer, or a combination thereof.

A plurality of gate lines 160 may be respectively on the plurality of fin-type active areas FA. Each of the plurality of gate lines 160 may extend in length in a second horizontal direction (Y direction) that intersects with or crosses with the first horizontal direction (X direction).

The plurality of nanosheet stacks NSS may be respectively on fin top surfaces FT of the plurality of fin-type active areas FA in areas where the plurality of fin-type active areas FA intersect with or cross the plurality of gate lines 160. Each of the plurality of nanosheet stacks NSS may include at least one nanosheet having a surface that faces the fin top surface FT and located at a position that is spaced apart from the fin top surface FT of the fin-type active area FA in a vertical direction (Z direction).

As illustrated in FIGS. 2A and 2B, each of the plurality of nanosheet stacks NSS may include a first nanosheet N1, a second nanosheet N2, and a third nanosheet N3 on the fin-type active area FA that are overlapping or that overlap each other in the vertical direction (Z direction). The first nanosheet N1, the second nanosheet N2, and the third nanosheet N3 may have different vertical distances (Z direction distances) from the fin top surface FT of the fin-type active area FA. FIGS. 2A and 2B illustrate the plurality of nanosheet stacks NSS including three nanosheets, but the inventive concepts are not limited thereto. The plurality of nanosheet stacks NSS may include four or more nanosheets and less than three nanosheets.

FIG. 1 illustrates the nanosheet stack NSS having a substantially rectangular planar shape, but is not limited thereto. The nanosheet stack NSS may have various planar shapes depending on the planar shape of each of the fin-type active area FA and the gate line 160. In the present specification, it is described that a plurality of nanosheet stacks NSS and the plurality of gate lines 160 are on one fin-type active area FA, and the plurality of nanosheet stacks NSS are on one fin-type active area FA in a line in the first horizontal direction (X direction). However, the number of the nanosheet stacks NSS and the number of gate lines 160 on one fin-type active area FA is not particularly limited.

Each of the first nanosheet N1, the second nanosheet N2, and the third nanosheet N3 included in the nanosheet stack NSS may be formed as a channel region. In the present specification, each of the first nanosheet N1, the second nanosheet N2, and the third nanosheet N3 may be referred to as a channel region. In some embodiments, each of the first nanosheet N1, the second nanosheet N2, and the third nanosheet N3 may have a thickness within a range of about 4 nm to about 6 nm, but is not limited thereto. Here, the thickness of each of the first nanosheet N1, the second nanosheet N2, and the third nanosheet N3 means a size in the vertical direction (Z direction). In some embodiments, the first nanosheet N1, the second nanosheet N2, and the third nanosheet N3 may have substantially the same thickness in the vertical direction (Z direction). In some embodiments, at least some of the first nanosheet N1, the second nanosheet N2, and the third nanosheet N3 may have different thicknesses in the vertical direction (Z direction) than others of the nanosheets of the nanosheet stack NSS.

In some embodiments, at least some of the first nanosheet N1, the second nanosheet N2, and the third nanosheet N3 included in one nanosheet stack NSS may have different sizes in the first horizontal direction (X direction). In some embodiments, at least some of the first nanosheet N1, the second nanosheet N2, and the third nanosheet N3 may have the same size in the first horizontal direction (X direction).

As shown in FIGS. 2A and 2B, each of the plurality of gate lines 160 may include a main gate portion 160M and a plurality of sub-gate portions 160S. The main gate portion 160M may cover a top surface of the nanosheet stack NSS and extend in length in the second horizontal direction (Y direction). The plurality of sub-gate portions 160S may be integrally connected to the main gate portion 160M, and each may be between ones of the first nanosheet N1, the second nanosheet N2, and the third nanosheet N3, or between the first nanosheet N1 and the fin-type active area FA. In the vertical direction (Z direction), a thickness of each of the plurality of sub-gate portions 160S may be less than a thickness of the main gate portion 160M.

Each of the plurality of gate lines 160 may be made of a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may be TiAlC. However, the materials constituting the plurality of gate lines 160 are not limited to the above examples.

A gate dielectric layer 152 may be between the nanosheet stack NSS and the gate line 160. In some embodiments, the gate dielectric layer 152 may have a stack structure of an interface dielectric layer and a high-k dielectric layer. The interface dielectric layer may include a low-k material layer having a dielectric constant equal to or less than about 9, for example, a silicon oxide layer, a silicon oxynitride layer, and/or a combination thereof. In some embodiments, the interface dielectric layer may be omitted. The high-k dielectric layer may be made of a material having a higher dielectric constant than that of the silicon oxide layer. For example, the high-k dielectric layer may have a dielectric constant of about 10 to about 25. The high-k dielectric layer may be made of hafnium oxide, but is not limited thereto.

As illustrated in FIG. 2A, a pair (e.g., first and second) of source/drain regions 130 may be on respective sides of one gate line 160, with the one gate line 160 therebetween on the fin-type active area FA. One source/drain regions 130 may be on the fin-type active area FA between a pair of adjacent nanosheet stacks NSS. The source/drain regions 130 may be in contact with a sidewall of the nanosheet stack NSS surrounded by the adjacent gate line 160.

First and second sidewalls of each of the plurality of gate lines 160 may be covered with outer insulating spacers 118. The outer insulating spacers 118 may cover first and second sidewalls of the main gate portion 160M on the top surfaces of the plurality of nanosheet stacks NSS. The outer insulating spacer 118 may be spaced apart from the gate line 160 with the gate dielectric layer 152 therebetween. The outer insulating spacer 118 may be made of silicon nitride, silicon oxide, SiCN, SiBN, SiON, SiOCN, SiBCN, SiOC, or a combination thereof. As used herein, the terms “SiCN”, “SiBN”, “SiON”, “SiOCN”, “SiBCN”, and “SiOC” refer to materials made of elements included in the respective terms, and are not chemical formulas indicating a stoichiometric relationship.

As illustrated in FIGS. 2A and 2B, each of the plurality of source/drain regions 130 may include a part overlapping the outer insulating spacer 118 in the vertical direction (Z direction). For example, the width of the part overlapping the outer insulating spacer 118 in the first horizontal direction (X direction) among the plurality of source/drain regions 130 in the vertical direction (Z direction) may be within a range of about 0 nm to about 4 nm. In some embodiments, each of the plurality of source/drain regions 130 may not include a part overlapping the main gate portion 160M in the vertical direction (Z direction).

First and second sidewalls of each of the plurality of sub-gate portions 160S may be spaced apart from the source/drain regions 130 with the gate dielectric layer 152 therebetween. The gate dielectric layer 152 may include a part in contact with the first semiconductor layer 132 of the source/drain regions 130.

As illustrated in FIG. 2A, a plurality of recesses R1 may be formed in the fin-type active area FA. A vertical level of the lowermost surface of each of the plurality of recesses R1 may be lower than a vertical level of the fin top surface FT of the fin-type active area FA. As used herein, the term “vertical level” may refer to a distance in the vertical direction (Z direction or −Z direction) from a main surface 102M of the substrate 102.

As illustrated in FIG. 2A, the plurality of source/drain regions 130 may be respectively in the plurality of recesses R1. Each of the plurality of source/drain regions 130 may be adjacent to at least one gate line 160 selected from among the plurality of gate lines 160. Each of the plurality of source/drain regions 130 may have sidewalls facing the first nanosheet N1, the second nanosheet N2, and the third nanosheet N3 included in the adjacent nanosheet stacks NSS. Each of the plurality of source/drain regions 130 may contact the first nanosheet N1, the second nanosheet N2, and the third nanosheet N3 included in the adjacent nanosheet stacks NSS. The plurality of source/drain regions 130 may have bottom surfaces in contact with the plurality of fin-type active areas FA.

In some embodiments, the integrated circuit device 100 according to the inventive concepts may have a pitch of about 40 nm to about 60 nm. In the present specification, the pitch may refer to an interval when substantially the same component is repeated. For example, the pitch of the plurality of source/drain regions 130 may refer to an interval at which the plurality of source/drain regions 130 between the plurality of gate lines 160 are repeated. Alternatively, the pitch of the plurality of source/drain regions 130 may refer to a distance between the lowermost surface of the plurality of source/drain regions 130 and the lowermost surface of the adjacent source/drain regions 130. Alternatively, the pitch of the plurality of source/drain regions 130 may refer to a distance P1 between center lines C1 and C2 illustrated in FIG. 2A. Alternatively, the pitch of the plurality of gate lines 160 may refer to a distance between a center line of the gate line 160 and a center line of the adjacent gate line 160 between the adjacent gate lines 160. The pitch of the plurality of source/drain regions 130 may be the same as that of each of the plurality of gate lines 160.

In some embodiments, as shown in FIGS. 3A and 3B, when the integrated circuit device 100 according to the inventive concepts includes the three nanosheets N1, N2, and N3, a pitch P1 of the plurality of source/drain regions 130 may be about 40 nm to about 60 nm. For example, when the integrated circuit device 100 includes the three nanosheets N1, N2, and N3, the pitch P1 of the plurality of source/drain regions 130 may be about 48 nm to about 52 nm.

In some embodiments, a depth D1 of each of the plurality of source/drain regions 130 of the integrated circuit device 100 according to the inventive concepts may be about 50 nm to about 80 nm. In the present specification, the depth D1 of each of the plurality of source/drain regions 130 may be a depth at which the plurality of recesses R1 are recessed in the channel region. That is, the depth D1 of each of the plurality of source/drain regions 130 may mean a depth from the uppermost surface of the channel region to the lowermost surface of the plurality of source/drain regions 130.

In some embodiments, as shown in FIGS. 3A and 3B, when the integrated circuit device 100 according to the inventive concepts includes the three nanosheets N1, N2, and N3, the depth D1 of each of the plurality of source/drain regions 130 may be about 50 nm to about 80 nm. For example, when the integrated circuit device 100 includes the three nanosheets N1, N2, and N3, the depth D1 of each of the plurality of source/drain regions 130 may be about 58 nm.

In some embodiments, as illustrated in FIGS. 2A and 2B, a top surface of each of the gate dielectric layer 152, the gate line 160, and the outer insulating spacer 118 may be covered with a capping insulating pattern 164. The capping insulating pattern 164 may include a silicon nitride layer.

The plurality of outer insulating spacers 118 and the plurality of source/drain regions 130 may be covered with an insulating liner 142. Each of the insulating liners 142 may be made of silicon nitride (SiN), silicon oxide (SiO), SiCN, SiBN, SiON, SiOCN, SiBCN, SiOC, or a combination thereof. In some embodiments, the insulating liner 142 may be omitted. An inter-gate insulating layer 144 may be on the insulating liner 142. The inter-gate insulating layer 144 may include a silicon nitride layer, a silicon oxide layer, SiON, SiOCN, or a combination thereof. When the insulating liner 142 is omitted, the inter-gate insulating layer 144 may contact the plurality of source/drain regions 130.

As illustrated in FIG. 1, a plurality of field-effect transistors TR may be formed on parts of the substrate 102 where the plurality of fin-type active areas FA intersect with the plurality of gate lines 160. The plurality of field-effect transistors TR may constitute a logic circuit or a memory device.

Referring to FIGS. 3A and 3B, each of the plurality of source/drain regions 130 may include a plurality of semiconductor layers. The plurality of semiconductor layers may include a first semiconductor layer 132, a second semiconductor layer 134 formed on the first semiconductor layer 132, and a third semiconductor layer 136 formed on the second semiconductor layer 134. In some embodiments, the plurality of semiconductor layers may further include a capping layer 138 formed on the third semiconductor layer 136.

In each of the plurality of source/drain regions 130, the first semiconductor layer 132 may include a part in contact with the channel region and a part in contact with the fin-type active area FA. That is, the first semiconductor layer 132 may include a part in contact with the first nanosheet N1, the second nanosheet N2, and the third nanosheet N3, a part in contact with the plurality of sub-gate portions 160S, and a part in contact with the fin-type active area FA.

The plurality of source/drain regions 130 may include at least one air gap AG located therein. In some embodiments, the at least one air gap AG may be located inside the plurality of semiconductor layers. That is, the at least one air gap AG may be located inside at least one of the first semiconductor layer 132, the second semiconductor layer 134, and the third semiconductor layer 136. For example, the at least one air gap AG may be located inside any one of the first semiconductor layer 132, the second semiconductor layer 134, and the third semiconductor layer 136. That is, as shown in FIG. 3A, the at least one air gap AG may be located inside the second semiconductor layer 134.

In some embodiments, the at least one air gap AG located inside the plurality of semiconductor layers may be one or more or three or less. In the present specification, the number of air gaps AG is three, but the number of air gaps AG is not limited thereto and may be one or two. Alternatively, in some embodiments, the number of air gaps AG may exceed three.

In some embodiments, the at least one air gap AG located inside the plurality of semiconductor layers may include the air gap AG spaced apart from the fin-type active area FA with some of the plurality of semiconductor layers therebetween. That is, the at least one air gap AG located inside the plurality of semiconductor layers may not include a part in contact with the fin-type active area FA. Stated differently, the fin-type active area FA may have no part exposed inside the at least one air gap AG. For example, as shown in FIG. 3A, when the air gap AG is located inside the second semiconductor layer 134, the air gap AG may be spaced apart from the fin-type active area FA with parts of the first semiconductor layer 132 and the second semiconductor layer 134 therebetween. Alternatively, even where the air gap AG differs from that shown in FIG. 3A and is located inside the first semiconductor layer 132, the air gap AG may be spaced apart from the fin-type active area FA with the fin-type active area FA with a part of the first semiconductor layer 132 therebetween.

In some embodiments, the integrated circuit device 100 according to the inventive concepts may not include an air gap AG between the plurality of fin-type active areas FA and the bottom surfaces of the plurality of source/drain regions 130.

In some embodiments, the at least one air gap AG inside the plurality of source/drain regions 130 of the integrated circuit device 100 according to the inventive concepts may reduce the width and increase the depth of each the plurality of source/drain regions 130, and thus, an aspect ratio (A/R) of the integrated circuit device 100 may be increased. That is, the integrated circuit device 100 including the at least one air gap AG as provided by the inventive concepts may be an integrated circuit device having an increased A/R.

Figure 10A:
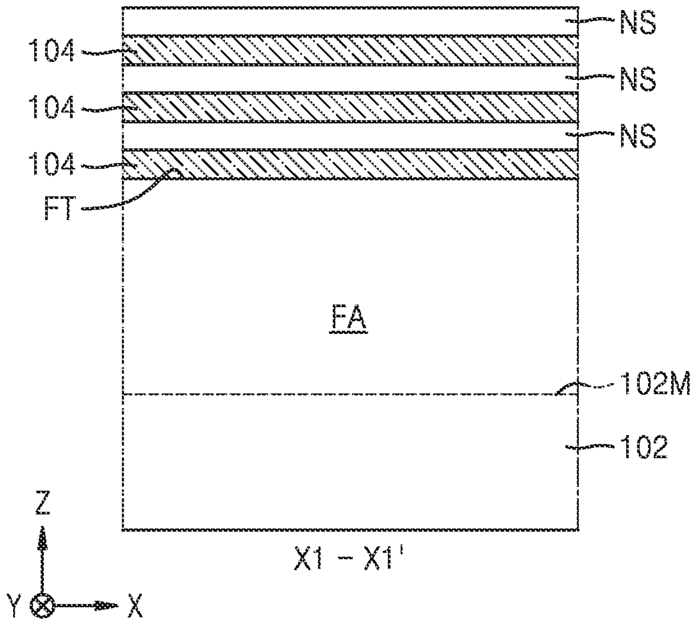
FIGS. 10A, 10B, 10C, 10D, 10E, 10F, 10G, 10H, 10I, 10J, 10K, 10L, and 10M are cross-sectional views illustrating a method of manufacturing an integrated circuit device, according to some embodiments.
Figure 10B:
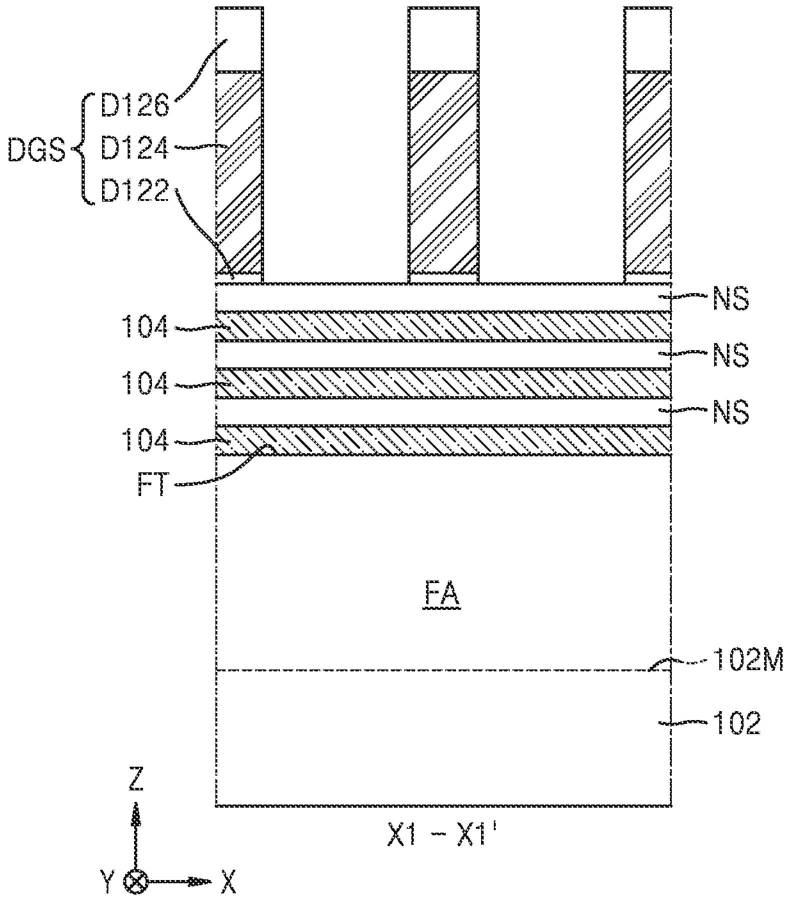
Figure 10C:
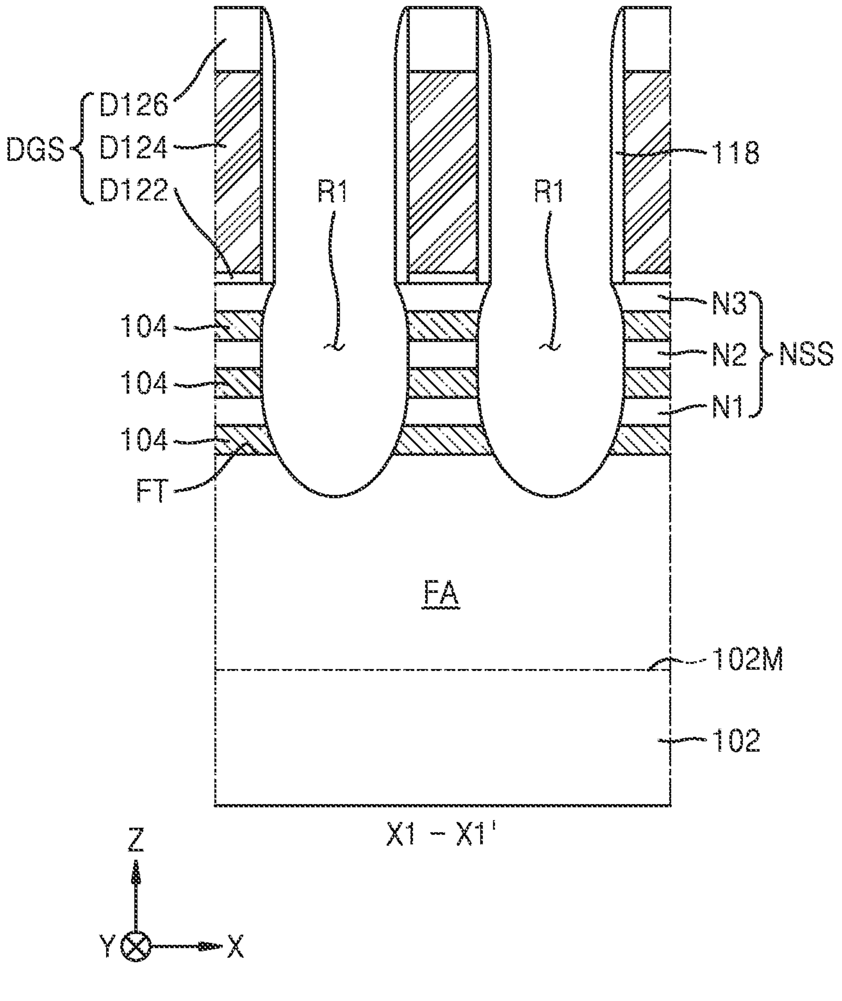
Figure 10D:
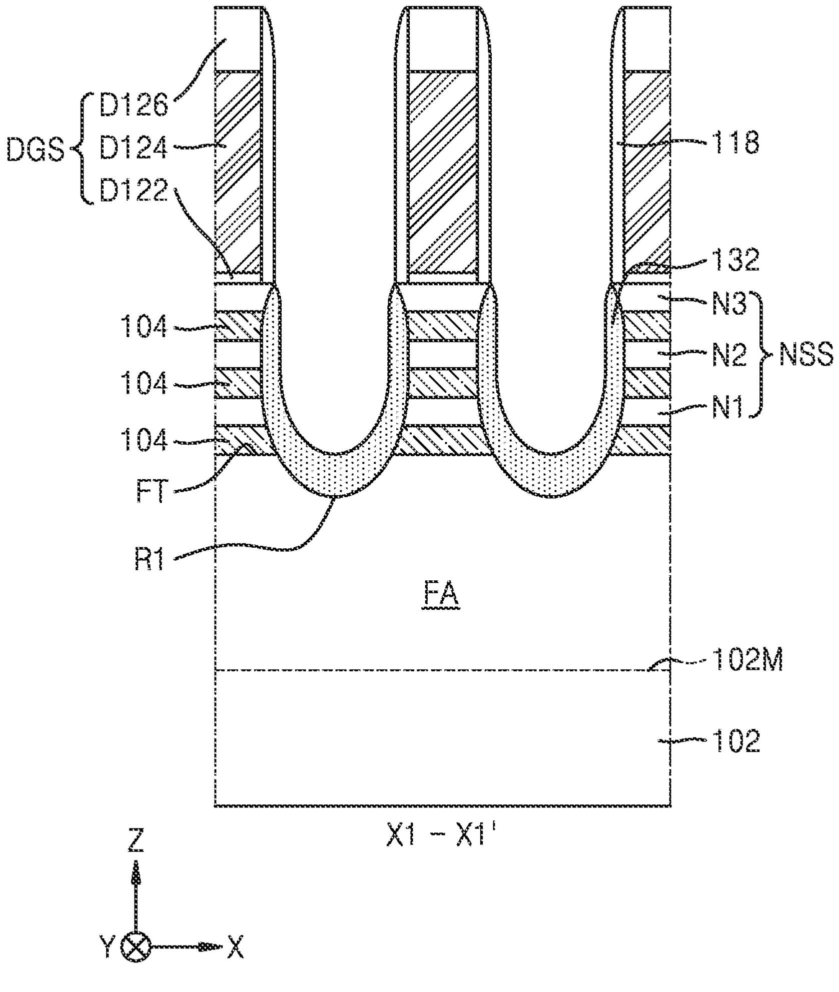
Figure 10E:
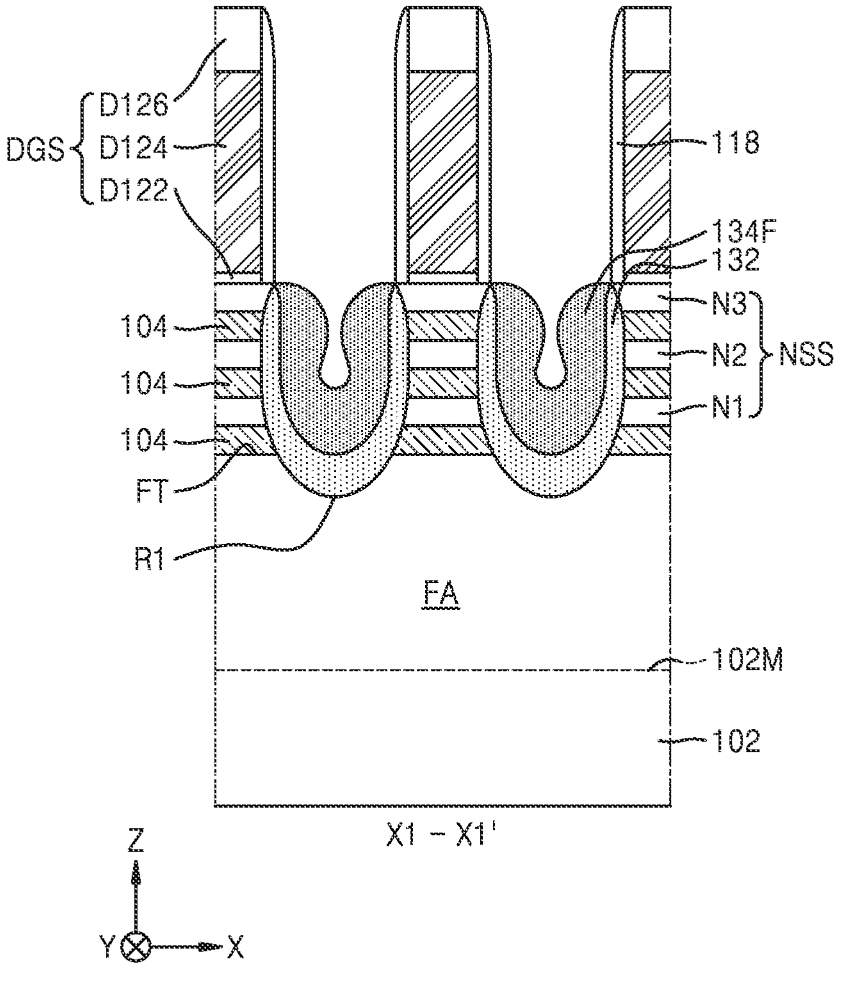

In some embodiments, the plurality of semiconductor layers of the plurality of source/drain regions 130 may epitaxially grown as illustrated in FIG. 10E, where the semiconductor layer on a side surface of the recess R1 grows relatively faster than the semiconductor layer on a bottom surface of the recess R1, and thus, the at least one air gap AG may be formed. That is, the semiconductor layers on the side surface of the recess R1 having the narrow width are in contact with each other, while the semiconductor layer on the bottom surface of the recess R1 having the large depth may not grow sufficiently and thus may form a void. Accordingly, the plurality of semiconductor layers may include the at least one air gap AG. The integrated circuit device 100 according to the inventive concepts may have improved performance and reliability by including the at least one air gap AG.

In some embodiments, surfaces with a [110] crystal direction growing from the side surface of the recess R1 may grow and a growth speed thereof may be increased, while a proportion and a growth speed of a surface with a [100] crystal direction growing from the bottom surface of the recess R1 may be reduced because a surface with a [111] crystal direction grows and a proportion thereof increases. As a result, the at least one air gap AG may be formed because the surfaces having the [110] crystal direction grown on the side surfaces of the recess R1 may come into in contact with each other, and the surface having the [100] crystal direction growing of the bottom surface of the recess R1 does not grow sufficiently.

In the source/drain regions 130, each of the first semiconductor layer 132, the second semiconductor layer 134, and the third semiconductor layer 136 may include a $Si_{1-x}Ge_x$ layer (where, x≠0) doped with a p-type dopant. Each of the first semiconductor layer 132, the second semiconductor layer 134, and the third semiconductor layer 136 may include the $Si_{1-x}Ge_x$ layer (where, x≠0) doped with the p-type dopant, and each of the Ge content ratio in the first semiconductor layer 132 and the Ge content ratio in the second semiconductor layer 134 may be smaller than the Ge content ratio in the third semiconductor layer 136.

In some embodiments, the first semiconductor layer 132, the second semiconductor layer 134, and the third semiconductor layer 136 have different Ge content ratios, each of the Ge content ratio in the first semiconductor layer 132 and the Ge content ratio in the second semiconductor layer 134 may be smaller than the Ge content ratio in the third semiconductor layer 136, and the Ge content ratio in the second semiconductor layer 134 may be greater than the Ge content ratio in the first semiconductor layer 132.

In some embodiments, the first semiconductor layer 132, the second semiconductor layer 134, and the third semiconductor layer 136 have different Ge content ratios, each of the Ge content ratio in the first semiconductor layer 132 and the Ge content ratio in the second semiconductor layer 134 may be smaller than the Ge content ratio in the third semiconductor layer 136, and the Ge content ratio in the second semiconductor layer 134 may be smaller than the Ge content ratio in the first semiconductor layer 132.

In some embodiments, each of the Ge content ratio in the first semiconductor layer 132 and the Ge content ratio in the second semiconductor layer 134 may be smaller than the Ge content ratio in the third semiconductor layer 136, and the Ge content ratio in the first semiconductor layer 132 may be the same as the Ge content ratio in the second semiconductor layer 134.

In some embodiments, the p-type dopant included in the source/drain regions 130 may be made of boron (B), gallium (Ga), carbon (C), or a combination thereof, but is not limited thereto.

The capping layer 138 may include an undoped Si layer, a Si layer doped with the p-type dopant, or a SiGe layer having a smaller Ge content ratio than that of the third semiconductor layer 136. In some embodiments, Ge may not be present in the capping layer 138. For example, the capping layer 138 may include the undoped Si layer. In some embodiments, the capping layer 138 may include a Si layer doped with B element or a SiGe layer doped with B element. In some embodiments, the capping layer 138 may be omitted.

In some embodiments, a thickness (BT1 in FIG. 3B) of the first semiconductor layer 132 in the vertical direction Z along a vertical line extending in the vertical direction (Z direction) from the lowermost surface thereof in contact with the fin-type active area FA may be about 1 nm to about 10 nm, and a thickness (BT3 in FIG. 3B) of the third semiconductor layer 136 along the vertical line may be about 10 nm to about 100 nm, but the inventive concepts are not limited thereto. In some embodiments, a thickness (BT2 in FIG. 3B) of the second semiconductor layer 134 may be greater than the thickness BT1 of the first semiconductor layer 132 and/or the thickness BT3 of the third semiconductor layer 136, but is not limited thereto. In some embodiments, the thickness BT1 of the first semiconductor layer 132, the thickness BT2 of the second semiconductor layer 134, and the thickness BT3 of the third semiconductor layer 136 may have various values.

In some embodiments, the plurality of semiconductor layers of the source/drain 130 may have various thicknesses in some cases. That is, the lowermost surface of the plurality of semiconductor layers may have various vertical levels in some cases. For example, as illustrated in FIG. 3B, a vertical level of a lowermost surface 132B of the first semiconductor layer 132 may be lower than a vertical level of the lowermost surface of the lowermost sub-gate portion 160S among the plurality of sub-gate portions 160S. As another example, a vertical level of a lowermost surface 134B of the second semiconductor layer 134 may be higher than the vertical level of the lowermost surface of the lowermost sub-gate portion 160S among the plurality of sub-gate portions 160S and may be lower than a vertical level of the lowermost surface of the lowermost first nanosheet N1 among the plurality of nanosheets. As another example, a vertical level of a lowermost surface 136B of the third semiconductor layer 136 may be lower than the vertical level of the lowermost surface of the uppermost sub-gate portion 160S among the plurality of sub-gate portions 160S, and may be higher than a vertical level of the lowermost surface of the second nanosheet N2.

Figure 4A:
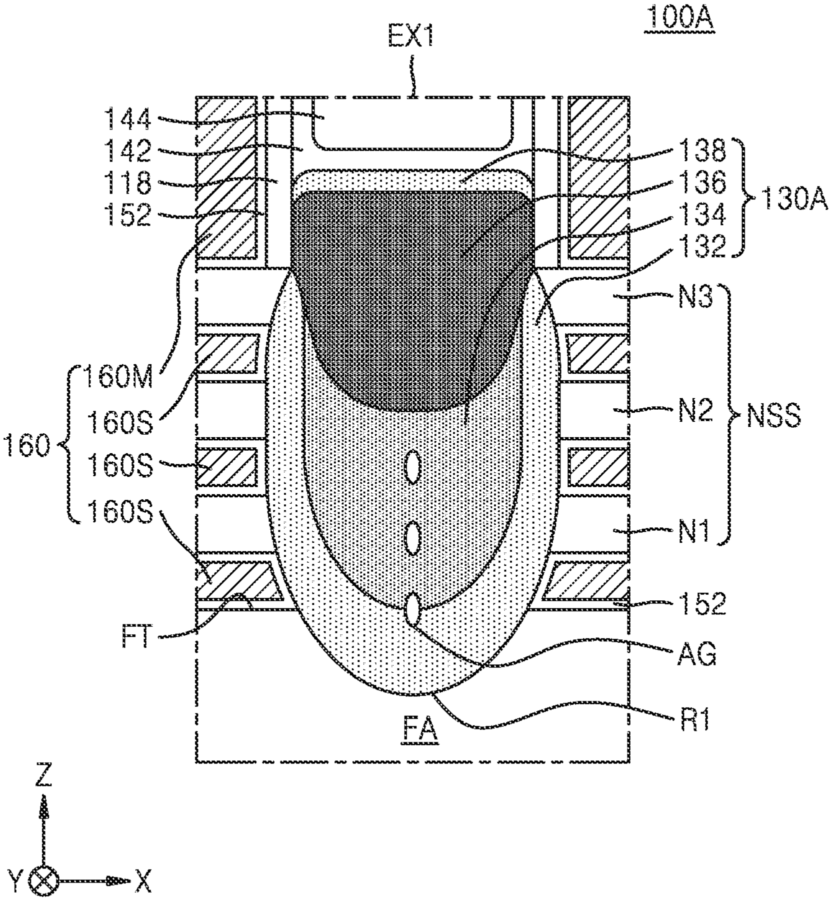
FIGS. 4A, 4B, and 4C are cross-sectional views illustrating integrated circuit devices according to some embodiments.
Figure 4B:
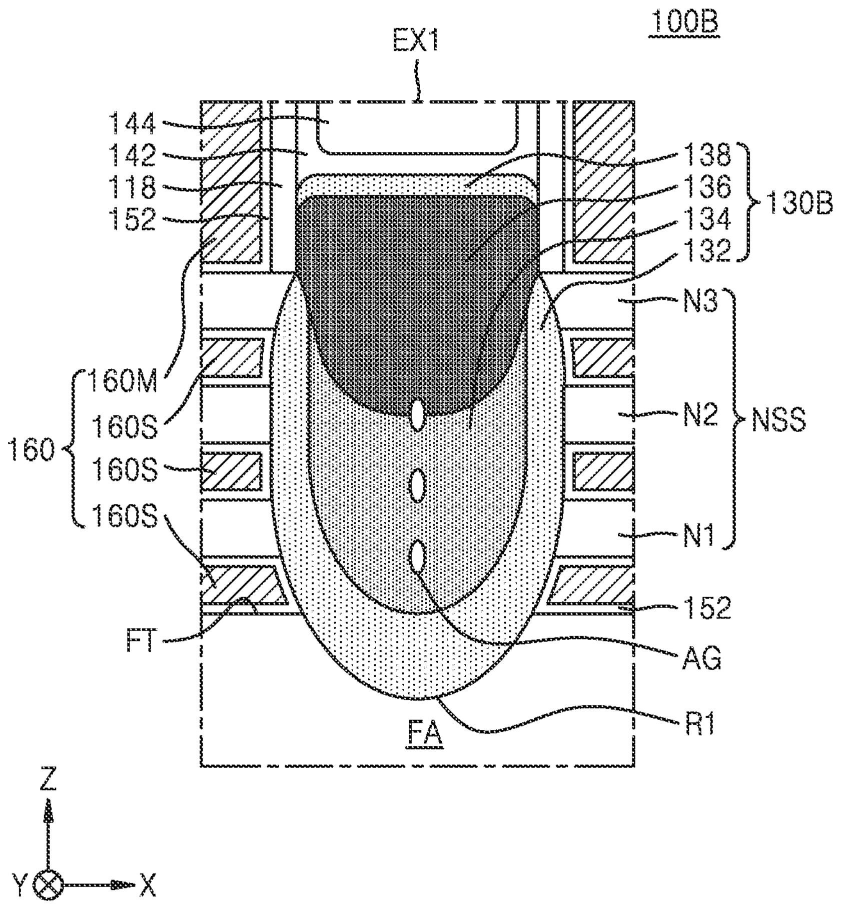
Figure 4C:
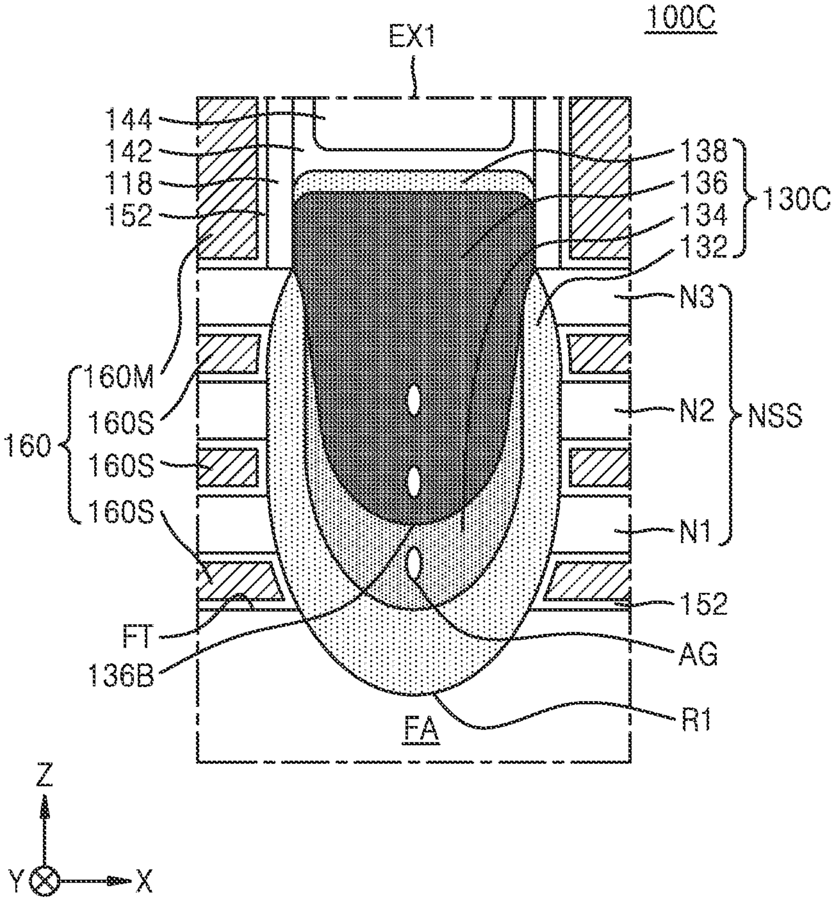

FIGS. 4A to 4C are cross-sectional views illustrating integrated circuit devices according to some embodiments. In FIGS. 4A to 4C, the same reference numerals as in FIGS. 1, 2A and 2B, and FIGS. 3A and 3B denote the same members, and redundant descriptions thereof are omitted herein.

Referring to FIGS. 4A to 4C, integrated circuit devices 100A, 100B, and 100C may have substantially the same configurations as the integrated circuit device 100 described with reference to FIGS. 1, 2A, 2B, 3A, and 3B. That is, a plurality of source/drain regions 130A, 130B, and 130C may include a plurality of semiconductor layers, and the plurality of semiconductor layers may include the first semiconductor layer 132, the second semiconductor layer 134 formed on the first semiconductor layer 132, and the third semiconductor layer 136 formed on the second semiconductor layer 134. In each of the plurality of source/drain regions 130A, 130B, and 130C, the first semiconductor layer 132 may include a part in contact with a channel region and a part in contact with the fin-type active area FA.

In some embodiments, each of the plurality of source/drain regions 130A, 130B, and 130C may include the at least one air gap AG located therein. In some embodiments, the at least one air gap AG may be located inside the plurality of semiconductor layers as illustrated in FIG. 3A. In some embodiments, the at least one air gap AG may include the air gap AG located between boundary surfaces of two different semiconductor layers among the plurality of semiconductor layers.

In some embodiments, as illustrated in FIG. 4A, the integrated circuit device 100A may include the at least one air gap AG located inside the plurality of semiconductor layers and the air gap AG located between boundary surfaces of two different semiconductor layers among the plurality of semiconductor layers. Specifically, the integrated circuit device 100A may include a first air gap AG located inside the second semiconductor layer 134 and a second air gap AG located between boundary surfaces of the first semiconductor layer 132 and the second semiconductor layer 134. That is, the integrated circuit device 100A may include an air gap AG having all surfaces in contact with the second semiconductor layer 134, and an air gap AG having a partial surface in contact with the first semiconductor layer 132 and a partial surface in contact with the second semiconductor layer 134. In some embodiments, the first air gap AG located inside the second semiconductor layer 134 may be spaced apart from the fin-type active area FA with parts of the first semiconductor layer 132 and the second semiconductor layer 134 therebetween, and the secondair gap AG located between boundary surfaces of the first semiconductor layer 132 and the second semiconductor layer 134 may also be spaced apart from the fin-type active area FA with a part of the first semiconductor layer 132 therebetween.

In some embodiments, as illustrated in FIG. 4B, the integrated circuit device 100B may include the at least one air gap AG located inside the plurality of semiconductor layers of which at least one the air gap AG may be located between the boundary surfaces of two different semiconductor layers among the plurality of semiconductor layers. Specifically, the integrated circuit device 100B may include a first air gap AG located inside the second semiconductor layer 134 and a second air gap AG located between boundary surfaces of the second semiconductor layer 134 and the third semiconductor layer 136. That is, the integrated circuit device 100B may include an air gap AG having all surfaces in contact with the second semiconductor layer 134, and an air gap AG having a partial surface in contact with the second semiconductor layer 134 and a partial surface in contact with the third semiconductor layer 136. In some embodiments, the first air gap AG located inside the second semiconductor layer 134 may be spaced apart from the fin-type active area FA with parts of the first semiconductor layer 132 and the second semiconductor layer 134 therebetween, and the second air gap AG located between boundary surfaces of the second semiconductor layer 134 and the third semiconductor layer 136 may also be spaced apart from the fin-type active area FA with parts of the first semiconductor layer 132 and the second semiconductor layer 134 therebetween.

In some embodiments, the integrated circuit device 100C illustrated in FIG. 4C may have the lowermost surface 136B of the third semiconductor layer 136 located at a lower level than that of the integrated circuit device 100 illustrated in FIGS. 3A and 3B. For example, the vertical level of the lowermost surface 136B of the third semiconductor layer 136 may be lower than the vertical level of the lowermost surface of the intermediate sub-gate portion 160S among the plurality of sub-gate portions 160S and may be higher than the vertical level of the lowermost surface of the lowermost first nanosheet N1 among the plurality of nanosheets. In this case, the vertical thickness of the third semiconductor layer 136 may increase, so that the at least one air gap AG may be located inside the third semiconductor layer 136 as illustrated in FIG. 4C.

As illustrated in FIG. 4C, the integrated circuit device 100C may include the at least one air gap AG located inside a plurality of different semiconductor layers. Specifically, the integrated circuit device 100C may include at least one air gap AG located inside the second semiconductor layer 134 and at least one air gap AG located inside the third semiconductor layer 136. That is, the integrated circuit device 100C may include a first air gap AG having all surfaces in contact with the second semiconductor layer 134 and a second air gap AG having all surfaces in contact with the third semiconductor layer 136. In some embodiments, the air gap AG located inside the second semiconductor layer 134 may be spaced apart from the fin-type active area FA with parts of the first semiconductor layer 132 and the second semiconductor layer 134 therebetween, and the air gap AG located inside the third semiconductor layer 136 may also be spaced apart from the fin-type active area FA with parts of the first semiconductor layer 132 and the second semiconductor layer 134 therebetween.

Figure 5:
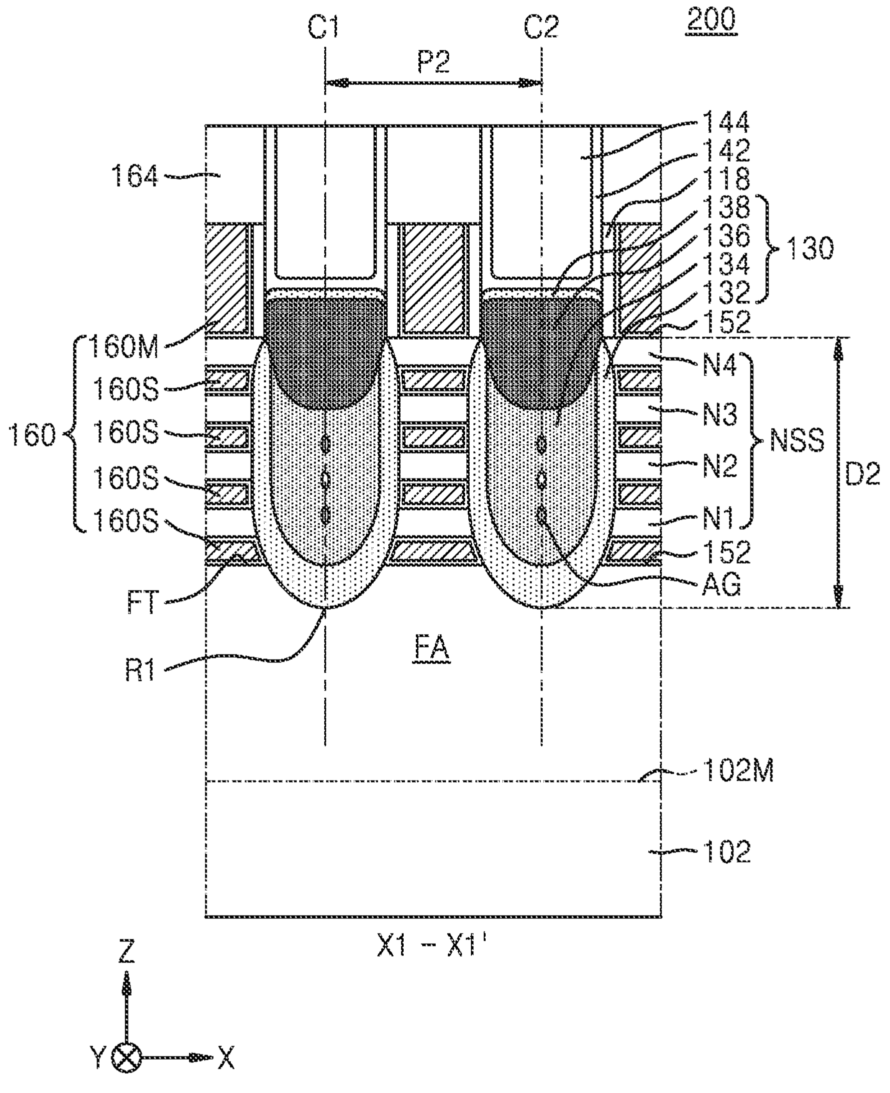
FIGS. 5, 6, and 7 are cross-sectional views illustrating integrated circuit devices according to some embodiments.
Figure 6:
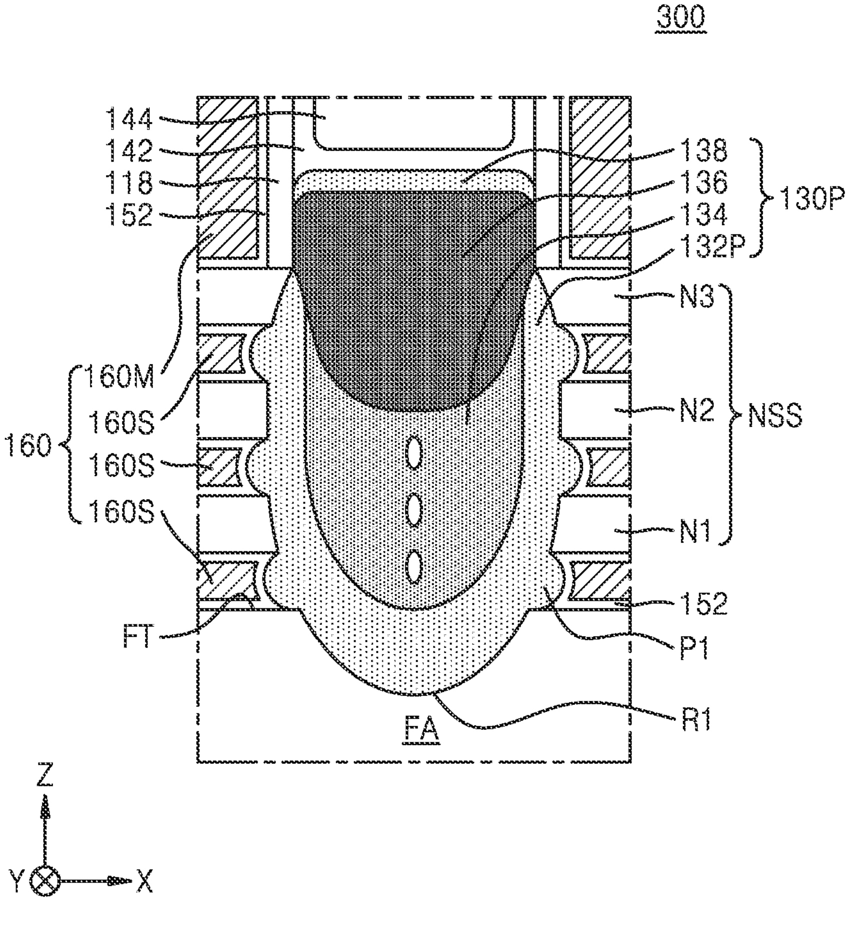
Figure 7:
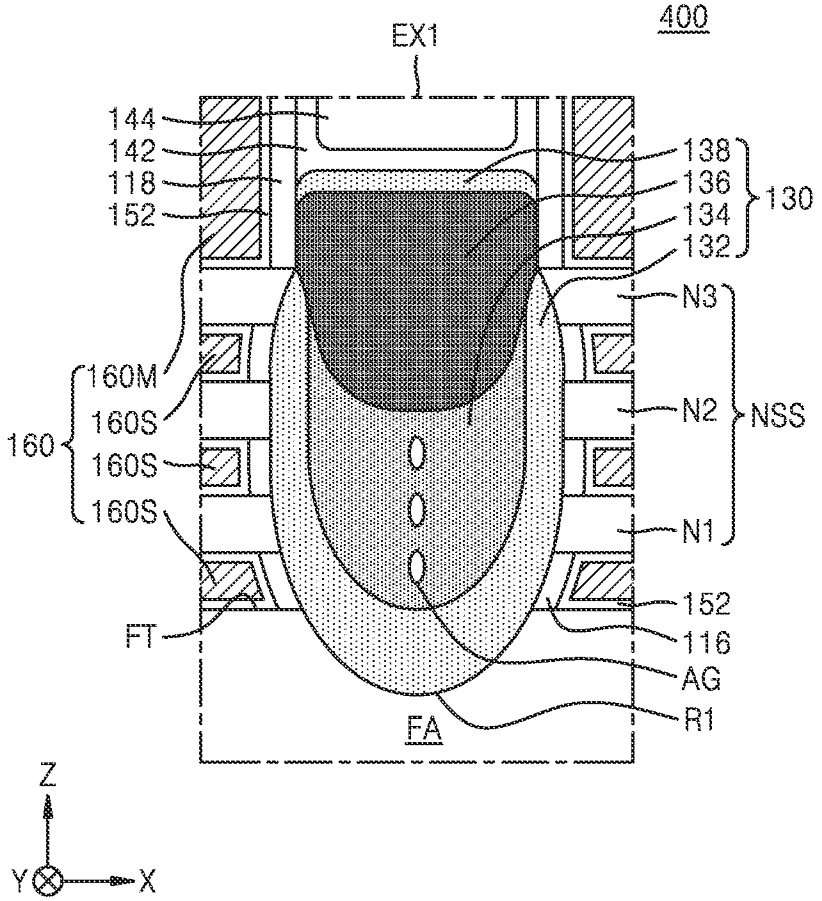

FIGS. 5 to 7 are cross-sectional views illustrating integrated circuit devices according to some embodiments. In FIGS. 5 to 7, the same reference numerals as in FIGS. 1, 2A and 2B, and FIGS. 3A and 3B denote the same members, and redundant descriptions thereof are omitted herein.

Referring to FIG. 5, an integrated circuit device 200 according to some embodiments may include the plurality of nanosheet stacks NSS on the fin top surfaces FT of the fin-type active areas FA at respective regions where the plurality of fin-type active areas FA intersect with the plurality of gate lines 160 Each of the plurality of nanosheet stacks NSS may include at least one nanosheet having a surface that faces the fin top surface FT at a position that is spaced apart from the fin top surface FT of the fin-type active area FA in the vertical direction (Z direction). While the plurality of nanosheet stacks NSS of the integrated circuit device 100 illustrated in FIGS. 2A and 2B include three nanosheets, the integrated circuit device 200 illustrated in FIG. 5 may include four nanosheets.

In some embodiments, each of the plurality of nanosheet stacks NSS may include the first nanosheet N1, the second nanosheet N2, the third nanosheet N3, and a fourth nanosheet N4 overlapping each other in the vertical direction (Z direction) on the fin-type active area FA. The first nanosheet N1, the second nanosheet N2, the third nanosheet N3, and the fourth nanosheet N4 may have different vertical distances (Z direction distances) from the fin top surface FT of the fin-type active area FA.

In some embodiments, each of the plurality of source/drain regions 130 of the integrated circuit device 200 may have sidewalls facing the first nanosheet N1, the second nanosheet N2, and the third nanosheet N3 and the fourth nanosheet N4 included in the adjacent nanosheet stack NSS. That is, each of the plurality of source/drain regions 130 may be in contact with the first nanosheet N1, the second nanosheet N2, the third nanosheet N3, and the fourth nanosheet N4 included in the adjacent nanosheet stack NSS.

In some embodiments, each of the plurality of gate lines 160 of the integrated circuit device 200 may include the main gate portion 160M and the plurality of sub-gate portions 160S, and the plurality of sub-gate portions 160S may be integrally connected to the main gate portion 160M and each may be between ones of the first nanosheet N1, the second nanosheet N2, the third nanosheet N3, and the fourth nanosheet N4, or between the first nanosheet N1 and the fin-type active area FA. That is, in some embodiments, the integrated circuit device 200 may include four sub-gate portions 160S.

In some embodiments, the integrated circuit device 200 according to the inventive concepts may have a pitch of about 40 nm to about 60 nm. In some embodiments, as shown in FIG. 5, when the integrated circuit device 200 according to the inventive concepts includes the four nanosheets N1, N2, N3, and N4, a pitch P2 of the plurality of source/drain regions 130 may be about 40 nm to about 60 nm. For example, when the integrated circuit device 200 includes the four nanosheets N1, N2, N3, and N4, the pitch P2 of the plurality of source/drain regions 130 may be about 42 nm.

In some embodiments, the depth of the plurality of source/drain regions 130 of the integrated circuit device 200 according to the inventive concepts may be about 50 nm to about 80 nm. In some embodiments, as shown in FIG. 5, when the integrated circuit device 200 according to the inventive concepts includes the four nanosheets N1, N2, N3, and N4, a depth D2 of each of the plurality of source/drain regions 130 may be about 50 nm to about 80 nm. For example, when the integrated circuit device 200 includes the four nanosheets N1, N2, N3, and N4, the depth D2 of each of the plurality of source/drain regions 130 may be about 70 nm.

The integrated circuit device 200 may have substantially the same configuration as the integrated circuit device 100 described with reference to FIGS. 1, 2A, 2B, 3A, and 3B. That is, the plurality of source/drain regions 130 may include a plurality of semiconductor layers, and may include the at least one air gap AG located inside the plurality of semiconductor layers. For example, as shown in FIG. 5, each of the at least one air gaps AG may be located inside the second semiconductor layer 134.

FIG. 6 is a cross-sectional view illustrating an integrated circuit device 300 according to some embodiments. FIG. 6 illustrates an enlarged cross-sectional configuration of an area of the integrated circuit device 300 corresponding to the local area indicated by "EX1" in FIG. 2A.

Referring to FIG. 6, the integrated circuit device 300 has substantially the same configuration as the integrated circuit device 100 described with reference to FIGS. 1, 2A, 2B, 3A, and 3B. However, the integrated circuit device 300 may include source/drain regions 130P filling the recess R1 on the fin-type active area FA.

The source/drain regions 130P may have substantially the same configuration as the source/drain regions 130 described with reference to FIGS. 2A, 2B, 3A, and 3B. However, the source/drain regions 130P may include a first semiconductor layer 132P having a plurality of protrusions P1 protruding toward the plurality of sub-gate portions 160S. In the source/drain regions 130P, the first semiconductor layer 132P may include a part in contact with the first nanosheet N1, the second nanosheet N2, and the third nanosheet N3, and a part in contact with the fin-type active area FA. The second semiconductor layer 134 may be on the first semiconductor layer 132P. The third semiconductor layer 136 may be on the second semiconductor layer 134.

A more detailed configuration of the first semiconductor layer 132P is similar to that of the first semiconductor layer 132 described with reference to FIGS. 2A, 2B, 3A, and 3B.

The plurality of source/drain regions 130P of the integrated circuit device 300 may include a plurality of semiconductor layers, and may include the at least one air gap AG located inside the plurality of semiconductor layers. For example, as shown in FIG. 6, each of the at least one air gaps AG may be located inside the second semiconductor layer 134.

FIG. 7 is a cross-sectional view illustrating an integrated circuit device 400 according to some embodiments. FIG. 7 illustrates an enlarged cross-sectional configuration of an area of the integrated circuit device 400 corresponding to the local area indicated by "EX1" in FIG. 2A.

Referring to FIG. 7, an integrated circuit device 400 has substantially the same configuration as the integrated circuit device 100 described with reference to FIGS. 1, 2A, 2B, 3A, and 3B. However, the integrated circuit device 400 may include inner insulating spacers 116. The inner insulating spacers 116 may be respectively located between adjacent nanosheets, for example, between the first nanosheet N1 and the second nanosheet N2 and between the second nanosheet N2 and the third nanosheet N3. The inner insulating spacers 116 may be located between the gate dielectric layer 152 and the source/drain regions 130. The inner insulating spacers 116 may be located between the gate dielectric layer 152 and the first semiconductor layer 132. That is, the inner insulating spacers 116 may be respectively located in a space defined by the first nanosheet N1, the second nanosheet N2, the gate dielectric layer 152, and the first semiconductor layer 132, and a space defined by the second nanosheet N2, the third nanosheet N3, the gate dielectric layer 152, and the first semiconductor layer 132.

The inner insulating spacers 116 may be made of silicon nitride, silicon oxide, SiCN, SiBN, SiON, SiOCN, SiBCN, SiOC, or a combination thereof.

Figure 8:
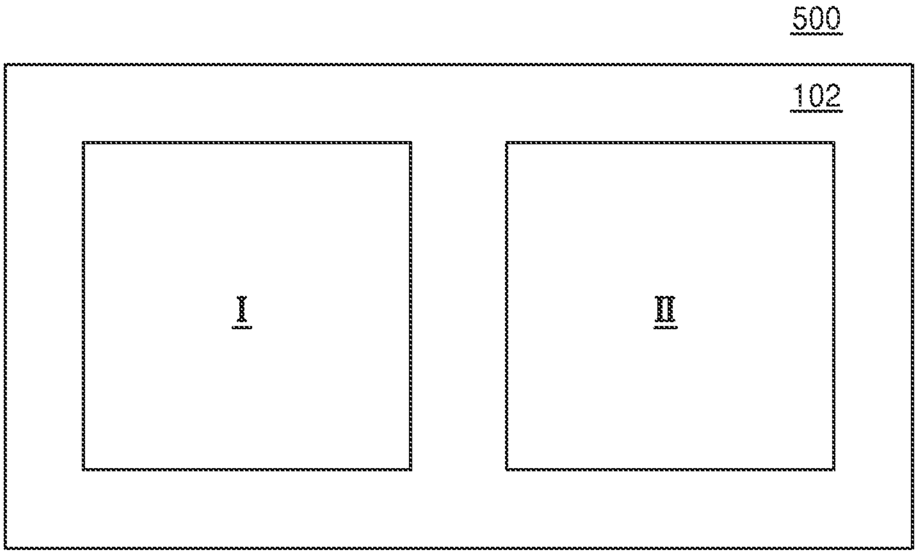
FIG. 8 is a block diagram of an integrated circuit device according to some embodiments.

FIG. 8 is a block diagram of an integrated circuit device 500 according to some embodiments.

Referring to FIG. 8, the integrated circuit device 500 may include the substrate 102 including a first region I and a second region II. The first region I and the second region II may be different regions of the substrate 102, and may be regions in which different operations are performed on the substrate 102. The first region I and the second region II may be spaced apart from each other in a horizontal direction. At least one of the first region I or the second region II may include at least one of configurations of the integrated circuit devices 100, 100A, 100B, 100C, 200, 300, and 400 described with reference to FIGS. 1 to 7.

In some embodiments, the first region I may be a region in which devices operating in a low power mode are formed, and the second region II may be a region in which devices operating in a high power mode are formed. In some embodiments, the first region I may be a region in which a memory device or a non-memory device is formed, and the second region II may be a region in which a peripheral circuit, such as an input/output device I/O, is formed.

In some embodiments, the first region I may be a region constituting a volatile memory device, such as dynamic random access memory (DRAM), static RAM (SRAM), etc., or a non-volatile memory device, such as read only memory (ROM), mask ROM (MROM), programmable ROM (PROM), erasable ROM (EPROM), electrically erasable ROM (EEPROM), ferromagnetic ROM (FRAM), phase change RAM (PRAM), magnetic RAM (MRAM), resistive RAM (RRAM), a flash memory, etc. In some embodiments, the first region I may be a region in which a non-memory device, such as a logic device, is formed. The logic device may include standard cells that perform a desired logical function, such as a counter and a buffer. The standard cells may include various types of logic cells including a plurality of circuit elements, such as transistors, resistors, etc. The logic cells may constitute, for example, an AND, a NAND, an OR, NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, etc.

Figure 9:
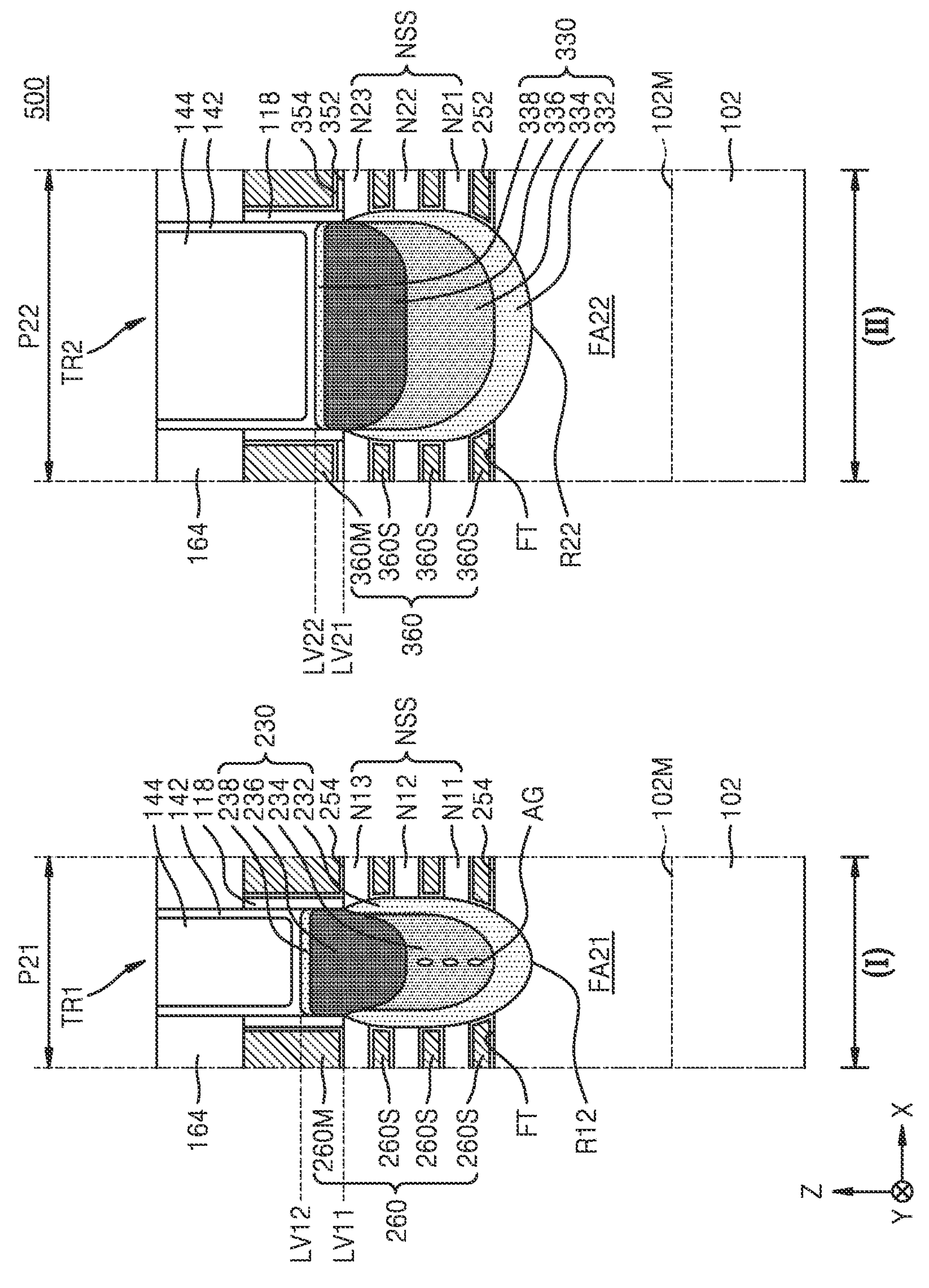
FIG. 9 is a cross-sectional view illustrating a configuration of the integrated circuit device illustrated in FIG. 8.

FIG. 9 is a cross-sectional view illustrating a configuration of an integrated circuit device 500 illustrated in FIG. 8.

Referring to FIG. 9, source/drain regions 230 may be in a recess R12 formed in an upper portion of a fin-type active area FA21 in the first region I, and a pair of gate lines 260 spaced apart with the source/drain regions 230 therebetween on the fin-type active area FA21 may have a first pitch P21 in a longitudinal direction (the first horizontal direction (X direction)) of the fin-type active area FA21. The gate lines 260 may extend in length in a second horizontal direction (Y direction). Also, source/drain regions 330 may be in a recess R22 formed in an upper portion of a fin-type active area FA22 in the second region II, and a pair of gate lines 360 spaced apart with the source/drain regions 330 therebetween may be on the fin-type active area FA22. The gate lines 360 may extend in length in a second horizontal direction (Y direction). In the second region II, the pair of gate lines 360 may have a second pitch P22 that is greater than the first pitch P21 in the longitudinal direction (first horizontal direction (X direction)) of the fin-type active area FA22. In some instances herein, the fin-type active area FA21 in the first region I may be referred to as a first fin-type active area, and the fin-type active area FA22 in the second region II may be referred to as a second fin-type active area. In some instances herein, the gate line 260 in the first region I may be referred to as a first gate line, and the gate line 360 in the second region II may be referred to as a second gate line. Also, in some instances herein, the source/drain regions 230 in the first region I may be referred to as first source/drain regions, and the source/drain regions 330 in the second region II may be referred to as second source/drain regions. More detailed configurations of the fin-type active areas FA21 and FA22, and the gate lines 260 and 360 are the same as those of the fin-type active area FA and the gate line 160 described with reference to FIGS. 1, 2A, and 2B.

In the second region II, the source/drain regions 330 may be between the pair of gate lines 360. The source/drain regions 330 may include a plurality of semiconductor layers, the plurality of semiconductor layers may include a fourth semiconductor layer 332 in contact with the fin-type active area FA22 forming an inner wall of the recess R22, a fifth semiconductor layer 334 on the fourth semiconductor layer 332, and a sixth semiconductor layer 336 on the fifth semiconductor layer 334.

In some embodiments, the source/drain regions 330 in the second region II may have the pitch P22 of about 60 nm to about 500 nm. That is, the pitch P22 of the source/drain regions 330 in the second region II may be greater than the pitch P21 of the source/drain regions 230 in the first region I. In some embodiments, the width of the source/drain regions 330 in the second region II may be greater than the width of the source/drain regions 230 in the first region I.

In some embodiments, each of the plurality of semiconductor layers of the source/drain regions 330 in the second region II may have a lower top surface than that of each of the plurality of semiconductor layers of the source/drain regions 230 in the first region I. That is, a vertical level L22 of the top surface of the source/drain regions 330 may be lower than a vertical level L12 of the top surface of the source/drain regions 230. In some embodiments, the vertical level L22 of the top surface of the source/drain regions 330 may be higher than a vertical level L21 of the uppermost surface of the channel region. The reason why the vertical level L22 of the top surface of the source/drain regions 330 is lower than the vertical level L12 of the top surface of the source/drain regions 230 may be that because the width of the source/drain regions 330 is greater than that of the source/drain regions 230, the growth of the plurality of semiconductor layers in the vertical direction (Z direction) in the source/drain regions 330 is smaller than the growth of the plurality of semiconductor layers in the vertical direction (Z direction) in source/drain regions 230. A more detailed configuration of a constituent material of each of the plurality of semiconductor layers of the source/drain regions 330 is the same as that of each of the plurality of semiconductor layers of the source/drain regions 130 described with reference to FIGS. 3A and 3B.

Alternatively, in some embodiments, and in contrast to that shown in FIG. 9, each of the plurality of semiconductor layers in the source/drain regions 330 may have a top surface at a lower vertical level than the vertical level L21 of the uppermost surface of the channel region. The plurality of semiconductor layers may not include a part in a space between a pair of main gate portions 360M.

In some embodiments, the plurality of semiconductor layers of the source/drain regions 330 in the second region II may not include the air gap AG. That is, the source/drain regions 330 in the second region II may not include the air gap AG inside the plurality of semiconductor layers, and may not include the air gap AG located between boundary surfaces of two different semiconductor layers among the plurality of semiconductor layers. This is because the semiconductor layer on the bottom surface of the recess R22 may grow sufficiently since the source/drain regions 330 in the second region II have a width greater than that of the source/drain regions 230 in the first region I, before the semiconductor layers on the side surface of the recess R22 grow and contact each other.

In some embodiments, the source/drain regions 330 in the second region II may have a depth of about 60 nm to about 90 nm.

An interface dielectric layer 352 and a gate dielectric layer 354 may be between the channel region and the main gate portion 360M. In some embodiments, the interface dielectric layer 352 may include a silicon oxide layer, and the gate dielectric layer 354 may include a high-k dielectric layer having a higher dielectric constant than that of the silicon oxide layer. A more detailed configuration of the gate dielectric layer 354 is substantially the same as that of the gate dielectric layer 152 described with reference to FIGS. 2A and 2B. A plurality of field-effect transistors TR2 may be formed in a part where the fin-type active area FA22 intersect with the gate line 360.

Both sidewalls of each of the pair of main gate portions 360M may be covered with the outer insulating spacers 118. The outer insulating spacers 118 may cover both sidewalls of the main gate portion 360M on the top surface of the channel region. Each of the source/drain regions 330 may include a part overlapping the outer insulating spacers 118 in the vertical direction (Z direction). The source/drain regions 330 and the plurality of outer insulating spacers 118 may each be covered with the insulating liner 142. The inter-gate insulating layer 144 may be on the insulating liner 142.

FIGS. 10A to 10M are cross-sectional views illustrating a method of manufacturing an integrated circuit device, according to some embodiments.

Referring to FIG. 10A, the plurality of fin-type active areas FA may be defined on the substrate 102 by alternately stacking a plurality of sacrificial semiconductor layers 104 and a plurality of nanosheet semiconductor layers NS on the substrate 102 one by one, and then etching the plurality of sacrificial semiconductor layers 104, the plurality of nanosheet semiconductor layers NS, and a part of the substrate 102. Thereafter, the device isolation layer 114 (see FIG. 1) covering sidewalls of each of the plurality of fin-type active areas FA may be formed. A stack structure of the plurality of sacrificial semiconductor layers 104 and the plurality of nanosheet semiconductor layers NS may remain on the fin top surface FT of each of the plurality of fin-type active areas FA.

The plurality of sacrificial semiconductor layers 104 and the plurality of nanosheet semiconductor layers NS may be made of semiconductor materials having different etch selectivity. In some embodiments, the plurality of nanosheet semiconductor layers NS may each include a Si layer, and the plurality of sacrificial semiconductor layers 104 may each include a SiGe layer. In some embodiments, the Ge content in the plurality of sacrificial semiconductor layers 104 may be constant. The SiGe layer included in each of the plurality of sacrificial semiconductor layers 104 may have the constant Ge content selected within a range of about 5 atomic % to about 60 atomic %, for example, about 10 atomic % to about 40 atomic %. The Ge content in the SiGe layer included in each of the plurality of sacrificial semiconductor layers 104 may be variously selected as necessary.

Referring to FIG. 10B, a plurality of dummy gate structures DGS may be formed on the stack structure of the plurality of sacrificial semiconductor layers 104 and the plurality of nanosheet semiconductor layers NS.

Each of the plurality of dummy gate structures DGS may be formed to extend in length in the second horizontal direction (Y direction). Each of the plurality of dummy gate structures DGS may have a structure in which an oxide layer D122, a dummy gate layer D124, and a capping layer D126 are sequentially stacked. In some embodiments, the dummy gate layer D124 may be made of polysilicon, and the capping layer D126 may include a silicon nitride layer.

Referring to FIG. 10C, the plurality of outer insulating spacers 118 covering both sidewalls of each of the plurality of dummy gate structures DGS may be formed, and then, a part of each of the plurality of sacrificial semiconductor layers 104 and the plurality of nanosheet semiconductor layers NS and a part of the fin-type active area FA may be etched by using the plurality of dummy gate structures DGS and the plurality of outer insulating spacers 118 as an etch mask, the plurality of nanosheet semiconductor layers NS may be divided into the plurality of nanosheet stacks NSS, and the plurality of recesses R1 may be formed in an upper portion of the fin-type active area FA. Each of the plurality of nanosheet stacks NS S may include the first nanosheet N1, the second nanosheet N2, and the third nanosheet N3. To form the plurality of recesses R1, dry etching, wet etching, or a combination thereof may be used.

Referring to FIG. 10D, the first semiconductor layer 132 may be formed on the fin-type active area FA at both sides of each of the plurality of nanosheet stacks NSS.

In some embodiments, to form the first semiconductor layer 132, a semiconductor material may be epitaxially grown from the surface of the fin-type active area FA exposed from the bottom surface of the recess R1, sidewalls of each of the first nanosheet N1, the second nanosheet N2, and the third nanosheet N3 included in the nanosheet stack NSS, and sidewalls of each of the plurality of sacrificial semiconductor layers 104.

In some embodiments, to form the first semiconductor layer 132, a low-pressure chemical vapor deposition (LPCVD) process, a selective epitaxial growth (SEG) process, or a cyclic deposition and etching (CDE) process may be performed by using raw materials including an elemental semiconductor precursor. The elemental semiconductor precursor may include a Si source, a Ge source, etc.

In some embodiments, to form the first semiconductor layer 132, the Si source and the Ge source may be used. As the Si source, silane ($SiH_4$), disilane ($Si_2H_6$), trisilane ($Si_3H_8$), dichlorosilane ($SiH_2Cl_2$), etc. may be used, but the inventive concepts are not limited thereto. As the Ge source, germane ($GeH_4$), digermane ($Ge_2H_6$), trigermane ($Ge_3H_8$), tetragermane ($Ge_4H_{10}$), dichlorogermane ($Ge_2H_2Cl_2$), etc. may be used, but the inventive concepts are not limited thereto. When the first semiconductor layer 132 includes a SiGe layer doped with B (boron) atom, as the B source, diborane ($B_2H_6$), triborane, tetraborane, pentaborane, etc. may be used, but the inventive concepts are not limited thereto.

In some embodiments, the epitaxial growth process for forming the first semiconductor layer 132 may be performed under a temperature selected within a range of about 600° C. to about 620° C., but is not limited thereto.

Figure 10F:
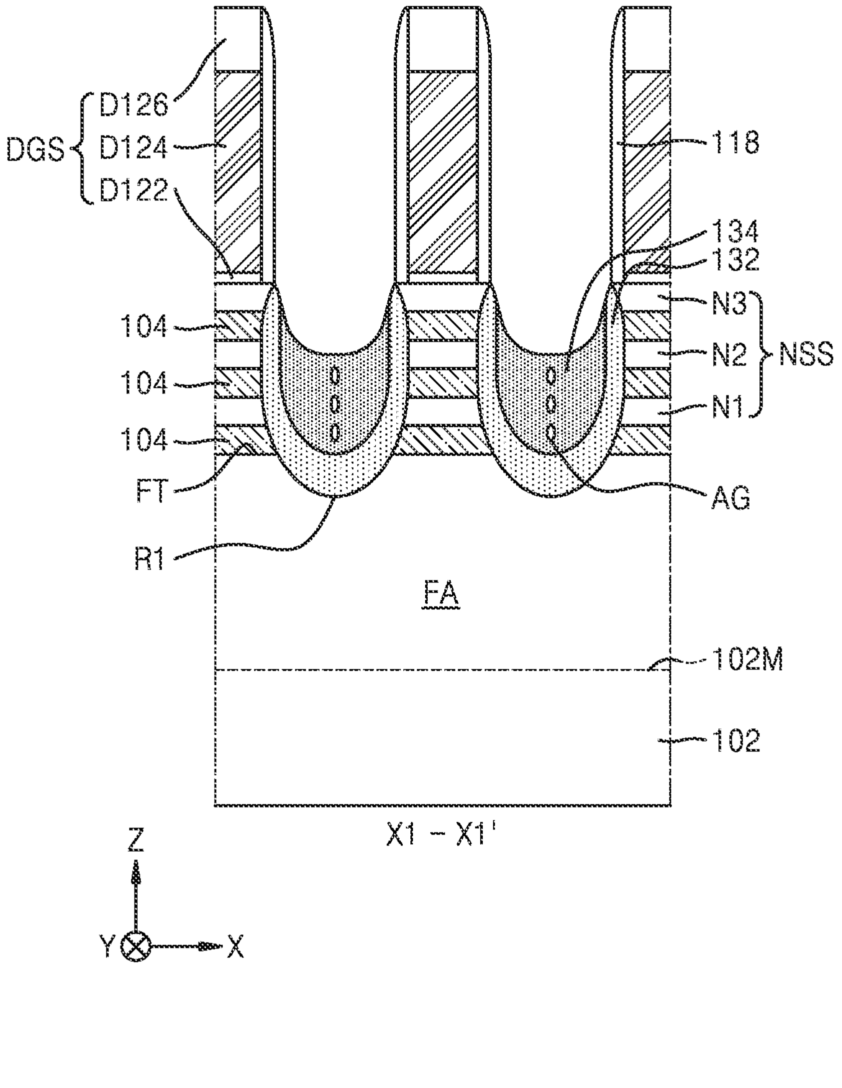

Referring to FIGS. 10E and 10F, the second semiconductor layer 134 may be formed on the first semiconductor layer 132. FIG. 10E is a diagram illustrating an intermediate process of forming the second semiconductor layer 134, and may be a process of forming a second free semiconductor layer 134F on the first semiconductor layer 132.

In some embodiments, to form the second semiconductor layer 134, a semiconductor material may be epitaxially grown on the first semiconductor layer 132. In the case of an integrated circuit device having an increased A/R according to some embodiments, the growth of the semiconductor layer on the side surface of the recess R1 may be relatively faster than the growth of the semiconductor layer on the bottom surface of the recess R1, and accordingly, the plurality of semiconductor layers may include the at least one air gap AG. In the present specification, the second free semiconductor layer 134F is exaggerated than the actual shape for better understanding.

Figure 10G:
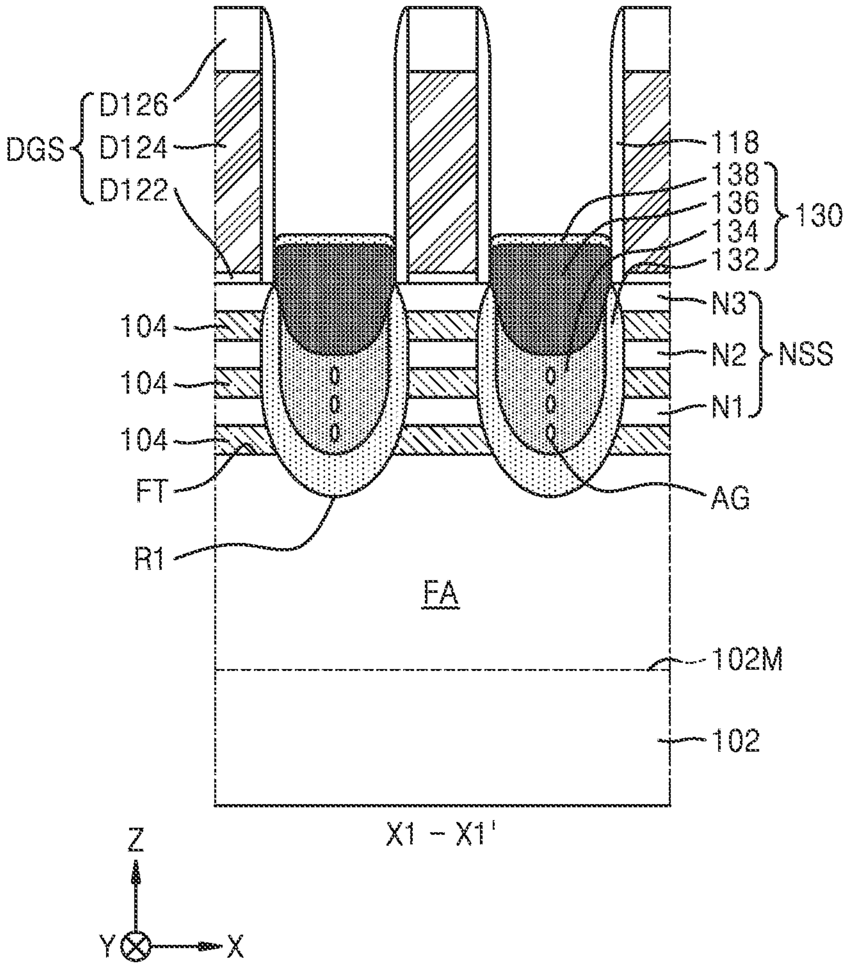

Referring to FIG. 10G, the plurality of source/drain regions 130 may be formed by sequentially forming the third semiconductor layer 136 and the capping layer 138 on a resultant in which the plurality of second semiconductor layers 134 of FIG. 10F are formed.

To form the third semiconductor layer 136 and the capping layer 138, processes similar to the process of forming the first semiconductor layer 132 described with reference to FIG. 10D may be performed. However, a process temperature during the epitaxial growth process for forming the third semiconductor layer 136 may be lower than a process temperature during the epitaxial growth process for forming the first semiconductor layer 132. In some embodiments, the epitaxial growth process for forming the third semiconductor layer 136 may be performed at about 550° C. to about 580° C., for example, about 570° C., but is not limited thereto. In some embodiments, to form the third semiconductor layer 136, a Si source, a Ge source, and a B source may be used.

Figure 10H:
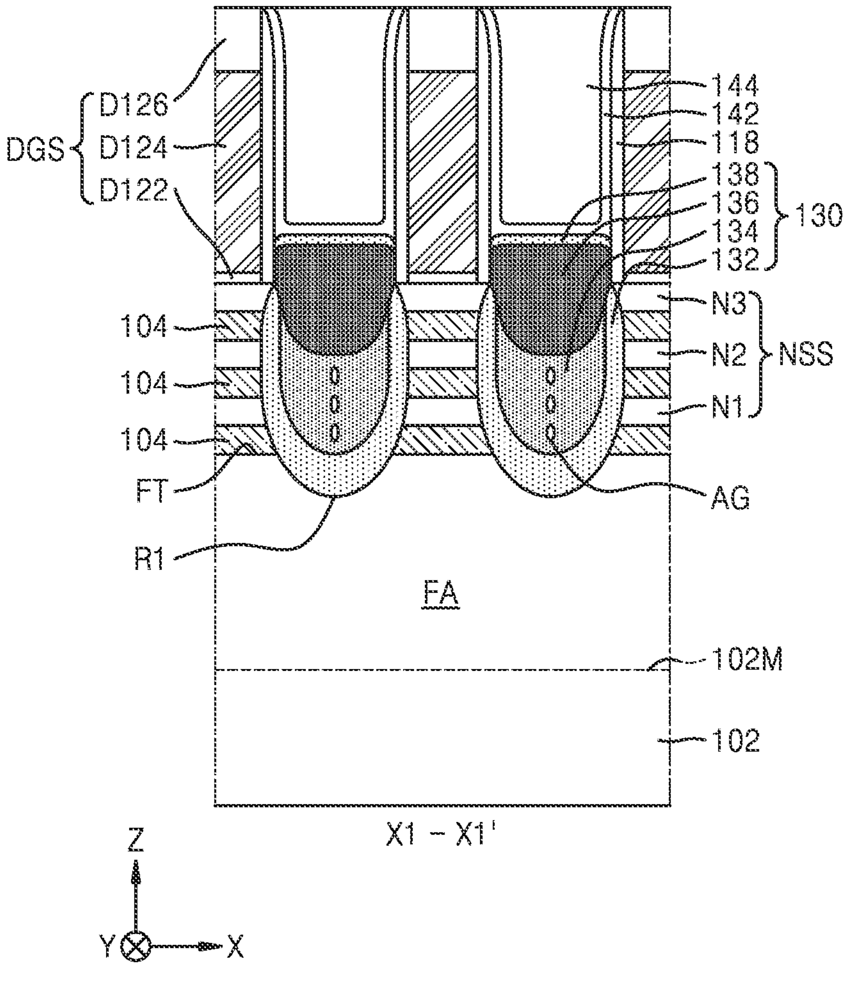

Referring to FIG. 10H, the insulating liner 142 covering the resultant of FIG. 10G in which the plurality of source/drain regions 130 is formed may be formed, the inter-gate insulating layer 144 may be formed on the insulating liner 142, and then, the top surface of the capping layer D126 may be exposed by planarizing the liner 142 and the inter-gate insulating layer 144.

Figure 10I:
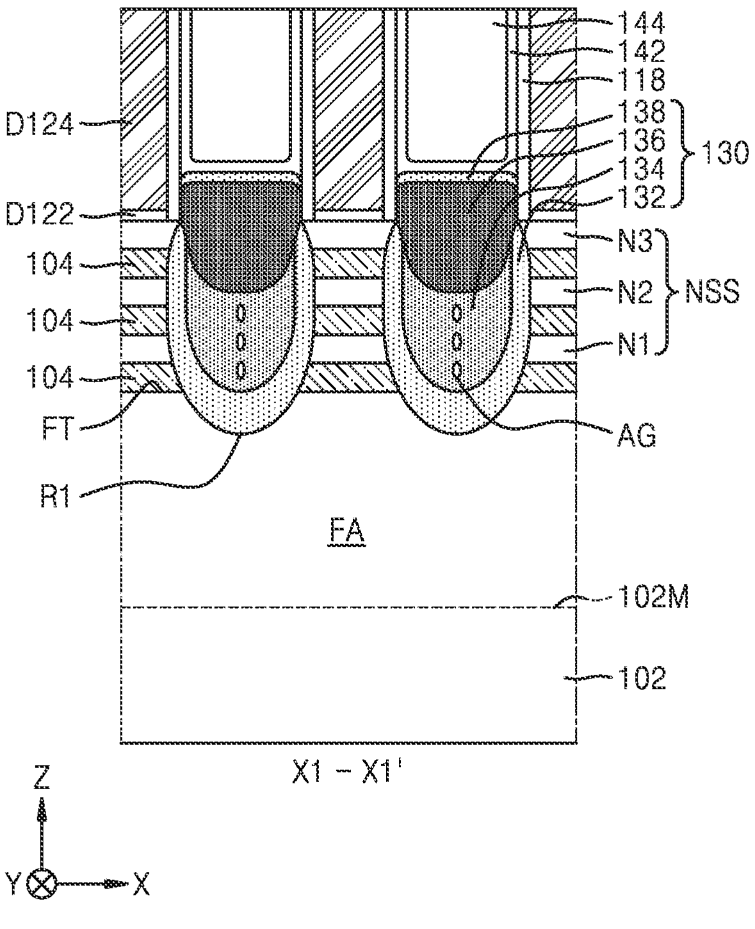

Referring to FIG. 10I, the top surface of the dummy gate layer D124 may be exposed by removing the capping layer D126 from the resultant of FIG. 10H, and the insulating liner 142 and the inter-gate insulating layer 144 may be partially removed so that the top surface of the inter-gate insulating layer 144 and the top surface of the dummy gate layer D124 may approximately have the same level.

Figure 10J:
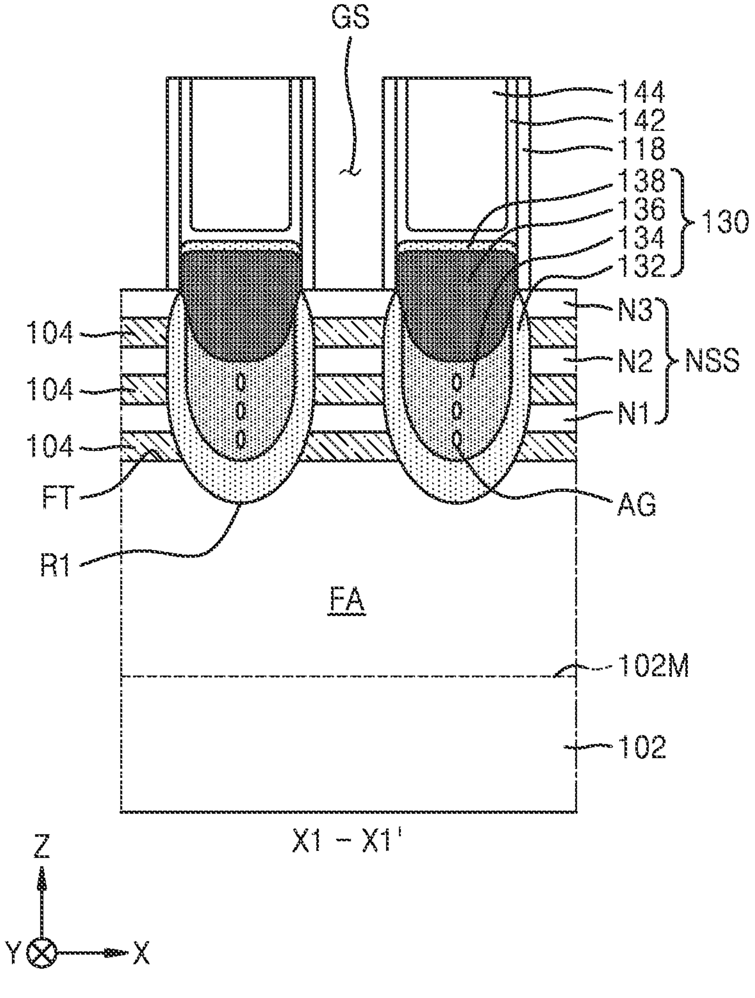

Referring to FIG. 10J, a gate space GS may be prepared by removing the dummy gate layer D124 and the oxide layer D122 therebelow from the resultant of FIG. 10I, and the plurality of nanosheet stacks NSS may be exposed.

Figure 10K:
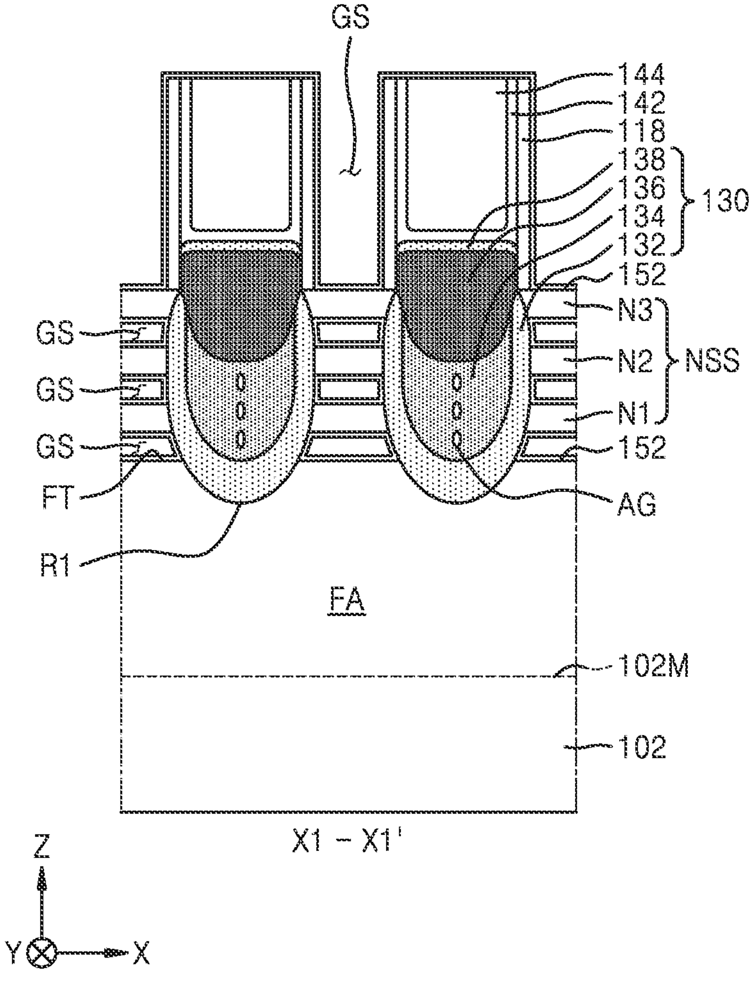

Referring to FIG. 10K, the gate space GS may be expanded to a space between each of the first nanosheet N1, the second nanosheet N2, and the third nanosheet N3, and to a space between the first nanosheet N1 and the fin top surface FT, by removing the plurality of sacrificial semiconductor layers 104 remaining on the fin-type active area FA from the result of FIG. 10J through the gate space GS.

In some embodiments, to selectively remove the plurality of sacrificial semiconductor layers 104, a difference in etch selectivity of the first nanosheet N1, the second nanosheet N2, and the third nanosheet N3 and the plurality of sacrificial semiconductor layers 104 may be used. A liquid or gaseous etchant may be used to selectively remove the plurality of sacrificial semiconductor layers 104. In some embodiments, to selectively remove the plurality of sacrificial semiconductor layers 104, a $CH_3COOH$-based etchant, for example, an etchant including a mixture of $CH_3COOH$, $HNO_3$, and HF, or an etchant including a mixture of $CH_3COOH$, $H_2O_2$, and HF may be used, but the inventive concepts are not limited thereto.

Thereafter, the gate dielectric layer 152 covering the exposed surfaces of the first nanosheet N1, the second nanosheet N2, and the third nanosheet N3 and the fin-type active area FA may be formed. An atomic layer deposition (ALD) process may be used to form the gate dielectric layer 152.

Figure 10L:
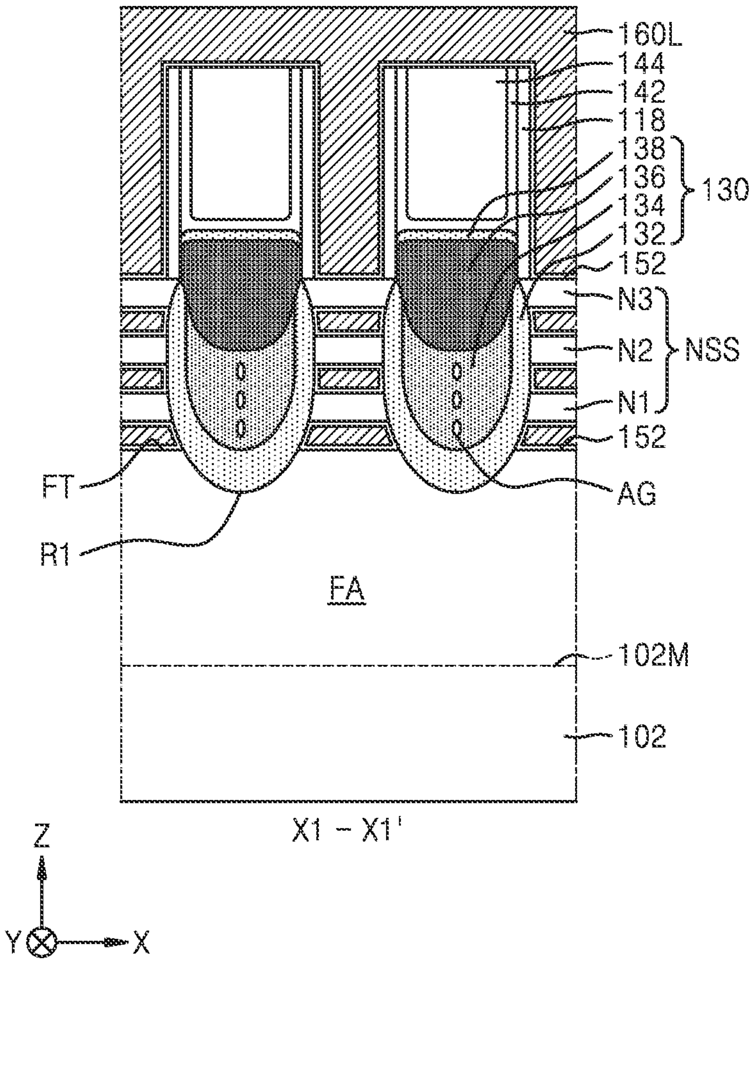

Referring to FIG. 10L, in the resultant of FIG. 10K, a conductive layer 160L for forming a gate may be formed on the gate dielectric layer 152 covering the top surface of the inter-gate insulating layer 144 while filling the gate space GS. The conductive layer 160L for forming the gate may be made of a metal, a metal nitride, a metal carbide, or a combination thereof. An ALD process or a CVD process may be used to form the conductive layer 160L for forming the gate.

Figure 10M:
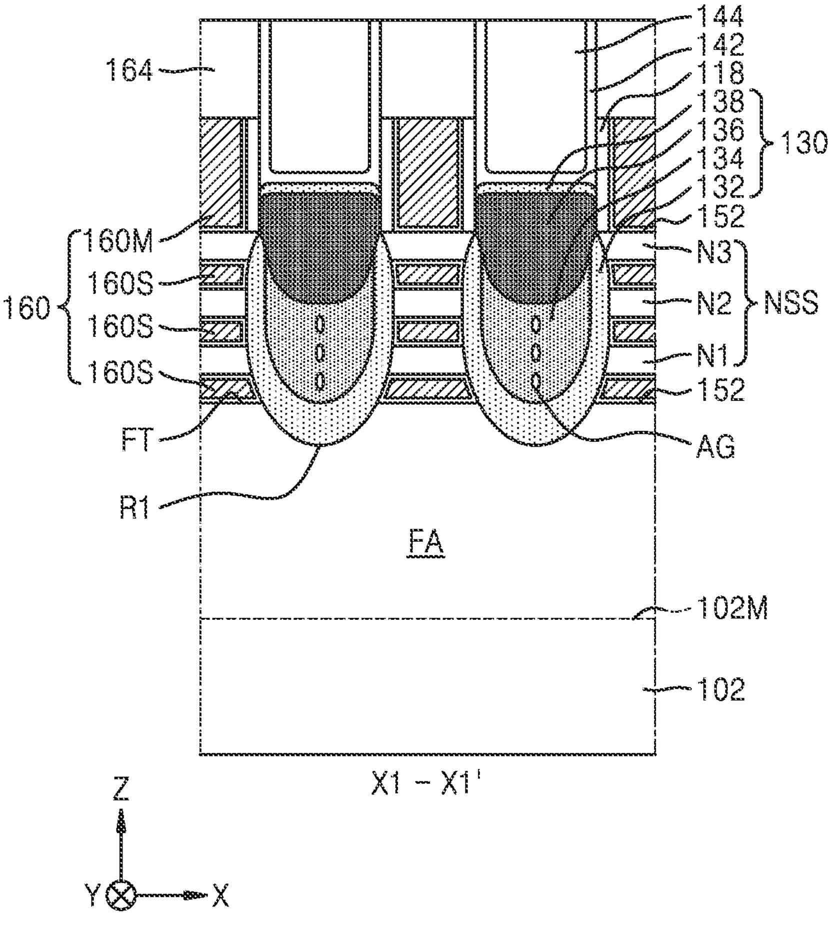

Referring to FIG. 10M, in the resultant of FIG. 10L, a top surface of the conductive layer 160L for forming the gate may be partially removed so that the top surface of the inter-gate insulating layer 144 is exposed and the upper end of the gate space GS is partially empty again. As a result, the plurality of gate lines 160 may be formed from the conductive layer 160L for forming the gate. At this time, in the gate space GS, the upper end of each of the gate dielectric layer 152 and the outer insulating spacer 118 may also be partially consumed so that the height of each of the gate dielectric layer 152 and the outer insulating spacer 118 may be lowered. Thereafter, the capping insulating pattern 164 filling the gate space GS may be formed on the gate line 160.

In the above, although the method of manufacturing the integrated circuit device 100 illustrated in FIGS. 1, 2A, 2B, 3A, and 3B has been described with reference to FIGS. 10A to 10M, it will be apparent to those skilled in the art that the integrated circuit devices 100, 100A, 100B, 100C, 200, 300, 400, and 500 illustrated in FIGS. 4A to 9, and integrated circuit devices having various structures modified and changed therefrom may be manufactured through various modifications and changes within the scope of the inventive concepts described with reference to FIGS. 10A to 10M.

While the inventive concepts have been particularly shown and described with reference to embodiments thereof, it will be understood that various changes in form and details may be made therein without departing from the scope of the following claims.

What is claimed is:

1. An integrated circuit device comprising:

a plurality of fin-type active areas extending in a first horizontal direction on a substrate;

a plurality of channel regions respectively on the plurality of fin-type active areas;

a plurality of gate lines surrounding the plurality of channel regions on the plurality of fin-type active areas and extending in a second horizontal direction that crosses the first horizontal direction; and a plurality of source/drain regions each arranged at positions adjacent to at least one of the plurality of gate lines on a respective one of the plurality of fin-type active areas and in contact with at least one of the plurality of channel regions, wherein each of the plurality of source/drain regions has a bottom surface in contact with the respective one of the plurality of fin-type active areas, wherein the plurality of source/drain regions include a first source/drain region and a second source/drain region;

wherein the plurality of source/drain regions respectively include a plurality of semiconductor layers and at least one air gap located therein, wherein the second source/drain region has a top most surface at a lower vertical level than a vertical level of the top surface of the first source/drain region, and does not include any air gap therein, and wherein the plurality of semiconductor layers include:

a first semiconductor layer including a part in contact with the at least one of the plurality of channel regions and a part in contact with the respective one of the plurality of fin-type active areas;

a second semiconductor layer on the first semiconductor layer; and a third semiconductor layer on the second semiconductor layer.

2. The integrated circuit device of claim 1, wherein the at least one air gap is located inside the plurality of semiconductor layers and includes an air gap spaced apart from the plurality of fin-type active areas with some portion of the plurality of semiconductor layers therebetween.

3. The integrated circuit device of claim 1, wherein the at least one air gap includes an air gap located between boundary surfaces of two different semiconductor layers among the plurality of semiconductor layers.

4. The integrated circuit device of claim 1, wherein a pitch of the plurality of source/drain regions in the first horizontal direction is about 40 nm to about 60 nm.

5. The integrated circuit device of claim 1, wherein the plurality of fin-type active areas include a first fin-type active area in a first region of the substrate and a second fin-type active area in a second region of the substrate, the plurality of gate lines include a pair of first gate lines on the first fin-type active area in the first region and spaced apart from each other in the first horizontal direction with a first distance therebetween, and a pair of second gate lines on the second fin-type active area in the second region and spaced apart from each other in the first horizontal direction with a second distance that is greater than the first distance therebetween, wherein the plurality of source/drain regions include first source/drain regions between the pair of first gate lines in the first region, and second source/drain regions between the pair of second gate lines in the second region, and wherein the first source/drain regions have a top surface at a higher vertical level than a vertical level of an uppermost surface of the plurality of channel regions.

6. The integrated circuit device of claim 5, wherein a pitch of the pair of second gate lines is about 60 nm to about 500 nm.

7. The integrated circuit device of claim 1, wherein:

each of the first semiconductor layer, the second semiconductor layer, and the third semiconductor layer includes a $Si_{1-x}Ge_x$ layer (where, x≠0) doped with a p-type dopant, and the first semiconductor layer, the second semiconductor layer, and the third semiconductor layer have different Ge content ratios.

8. The integrated circuit device of claim 1, wherein:

each of the first semiconductor layer, the second semiconductor layer, and the third semiconductor layer includes a $Si_{1-x}Ge_x$ layer (where, x≠0) doped with a p-type dopant, a Ge content ratio of the first semiconductor layer is smaller than a Ge content ratio of the second semiconductor layer, and the Ge content ratio of the second semiconductor layer is smaller than a Ge content ratio of the third semiconductor layer.

9. The integrated circuit device of claim 1, wherein:

the plurality of channel regions respectively include a plurality of nanosheets facing fin top surfaces of the plurality of fin-type active areas at positions spaced apart from the fin top surfaces and having different vertical distances from the fin top surfaces, and the plurality of source/drain regions are respectively in contact with the plurality of nanosheets.

10. The integrated circuit device of claim 1, wherein an air gap is absent from between the plurality of fin-type active areas and bottom surfaces of the plurality of source/drain regions.

11. An integrated circuit device comprising:

a plurality of fin-type active areas extending in a first horizontal direction on a substrate;

a plurality of nanosheets having surfaces that face fin top surfaces of the plurality of fin-type active areas, each of the plurality of nanosheets spaced apart from the fin top surfaces at different distances in a vertical direction;

a plurality of gate lines extending in length on the plurality of fin-type active areas in a second horizontal direction that crosses the first horizontal direction, each of the plurality of gate lines surrounding the plurality of nanosheets; and a plurality of source/drain regions having side surfaces that face the plurality of nanosheets in the first horizontal direction, wherein the plurality of source/drain regions respectively have bottom surfaces in contact with the plurality of fin-type active areas, wherein each of the plurality of source/drain regions includes a respective plurality of semiconductor layers and at least one air gap located therein, wherein the at least one air gap includes an air gap located inside each of the plurality of semiconductor layers, and wherein each respective plurality of semiconductor layers includes:

a first semiconductor layer in contact some of the plurality of nanosheets in contact with at least one of the plurality of fin-type active areas;

a second semiconductor layer on the first semiconductor layer; and a third semiconductor layer on the second semiconductor layer.

12. The integrated circuit device of claim 11, wherein the at least one air gap includes an air gap located between boundary surfaces of two different semiconductor layers among the plurality of semiconductor layers.

13. The integrated circuit device of claim 11, wherein:

the plurality of fin-type active areas include a first fin-type active area in a first region of the substrate and a second fin-type active area in a second region of the substrate, the plurality of nanosheets include a plurality of first nanosheets spaced apart from a first fin top surface of the first fin-type active area in the vertical direction, and a plurality of second nanosheets spaced apart from a second fin top surface of the second fin-type active area in the vertical direction, the plurality of gate lines include a pair of first gate lines on the first fin-type active area in the first region and spaced apart from each other in the first horizontal direction with a first distance therebetween, and a pair of second gate lines on the second fin-type active area in the second region and spaced apart from each other in the first horizontal direction with a second distance that is greater than the first distance therebetween, the plurality of source/drain regions include a first source/drain region between the pair of first gate lines in the first region, and a second source/drain region between the pair of second gate lines in the second region, the first source/drain region has a top surface at a higher vertical level than a vertical level of a top surface of a nanosheet having a greatest vertical distance from the fin top surface among the plurality of first nanosheets, the second source/drain region has a top surface at a lower vertical level than a vertical level of the top surface of the first source/drain region, and the second source/drain region does not include an air gap therein.

14. The integrated circuit device of claim 11, wherein:

each of the first semiconductor layer, the second semiconductor layer, and the third semiconductor layer includes a $Si_{1-x}Ge_x$ layer (where, x≠0) doped with a p-type dopant, and the first semiconductor layer, the second semiconductor layer, and the third semiconductor layer have different Ge content ratios.

15. The integrated circuit device of claim 11, wherein:

each of the first semiconductor layer, the second semiconductor layer, and the third semiconductor layer includes a $Si_{1-x}Ge_x$ layer (where, x≠0) doped with a p-type dopant, a Ge content ratio of the first semiconductor layer is smaller than a Ge content ratio of the second semiconductor layer, and the Ge content ratio of the second semiconductor layer is smaller than a Ge content ratio of the third semiconductor layer.

16. The integrated circuit device of claim 11, wherein the plurality of source/drain regions are respectively in contact with the plurality of nanosheets.

17. An integrated circuit device comprising:

a first fin-type active area extending in a first horizontal direction on a substrate and in a first region of the substrate;

a second fin-type active area extending in the first horizontal direction on the substrate and in a second region of the substrate;

a pair of first nanosheet stacks each including a plurality of first nanosheets having surfaces that face a first fin top surface of the first fin-type active area and spaced apart from the first fin top surface at different distances in a vertical direction;

a pair of second nanosheet stacks each including a plurality of second nanosheets having surfaces that face a second fin top surface of the second fin-type active area and spaced apart from the second fin top surface at different distances in the vertical direction;

a pair of first gate lines on the pair of first nanosheet stacks on the first in the first region, extending in length in a second horizontal direction that crosses the first horizontal direction, the pair of first gate lines spaced apart from each other in the first horizontal direction with a first distance therebetween a pair of second gate lines on the pair of second nanosheet stacks on the second fin-type active area in the second region, extending in length in the second horizontal direction and spaced apart from each other in the first horizontal direction with a second distance that is greater than the first distance therebetween;

a first source/drain region in contact with the plurality of first nanosheets between the pair of first nanosheet stacks in the first region and on the first fin-type active area; and a second source/drain region in contact with the plurality of second nanosheets between the pair of second nanosheet stacks in the second region and on the second fin-type active area, wherein the first source/drain region has a bottom surface in contact with the first fin-type active area, wherein the first source/drain region includes a plurality of semiconductor layers and at least one air gap located therein, wherein the plurality of semiconductor layers include:

a first semiconductor layer including a part in contact with each of the pair of first nanosheets and a part in contact with the first fin-type active area;

a second semiconductor layer on the first semiconductor layer; and a third semiconductor layer on the second semiconductor layer, wherein each of the first semiconductor layer, the second semiconductor layer, and the third semiconductor layer includes a $Si_{1-x}Ge_x$ layer doped with boron (where, $x \neq 0$), wherein the first semiconductor layer, the second semiconductor layer, and the third semiconductor layer have different Ge content ratios, wherein the first source/drain region has a top surface at a higher vertical level than a vertical level of a top surface of a nanosheet having a greatest vertical distance from the first fin top surface among the plurality of first nanosheets, and wherein the second source/drain region has a top surface at a lower vertical level than a vertical level of the top surface of the first source/drain region, and wherein the second source/drain region does not include an air gap therein.

18. The integrated circuit device of claim 17, wherein the at least one air gap includes an air gap located inside each of the plurality of semiconductor layers.

19. The integrated circuit device of claim 17, wherein the at least one air gap includes an air gap located between boundary surfaces of two different semiconductor layers among the plurality of semiconductor layers.

* * * * *